(12) United States Patent
Gilboa et al.

(10) Patent No.: US 6,191,011 B1
(45) Date of Patent: Feb. 20, 2001

(54) SELECTIVE HEMISPHERICAL GRAIN SILICON DEPOSITION

(75) Inventors: Yitzhak Eric Gilboa, Cupertino, CA (US); Benjamin Brosilow, Afula (IL); Sagy Levy; Hedvi Spielberg, both of Sunnyvale, CA (US); Itai Bransky, Haifa (IL)

(73) Assignee: AG Associates (Israel) Ltd. (IL)

(*) Notice: Under 35 U.S.C. 154(b), the term of this patent shall be extended for 0 days.

(21) Appl. No.: 09/167,005

(22) Filed: Sep. 28, 1998

(51) Int. Cl.$^7$ .................................................. H01L 21/36
(52) U.S. Cl. ..................... 438/488; 438/478; 438/480; 438/481; 438/482; 438/483; 438/484; 438/485; 438/486; 438/487; 257/49; 257/50; 257/51; 257/52
(58) Field of Search ................................. 438/488, 478, 438/480–87; 257/49–52

(56) References Cited

U.S. PATENT DOCUMENTS

| | | | |
|---|---|---|---|
| 5,002,630 | 3/1991 | Kermani et al. | 156/610 |
| 5,228,206 | 7/1993 | Grant et al. | 34/1 |
| 5,324,684 | 6/1994 | Kermani et al. | 437/95 |
| 5,385,863 | 1/1995 | Tatsumi et al. | 437/109 |
| 5,407,534 | 4/1995 | Thakur | 156/662 |
| 5,520,002 * | 5/1996 | Ishikawa | 62/55.5 |
| 5,521,108 * | 5/1996 | Rostoker et al. | 437/43 |
| 5,629,223 | 5/1997 | Thakur | 438/964 |
| 5,634,974 | 6/1997 | Weimer et al. | 117/103 |
| 5,656,531 | 8/1997 | Thakur et al. | 438/398 |
| 5,770,500 * | 6/1998 | Batra et al. | 438/255 |
| 5,854,097 * | 12/1998 | Ohmi et al. | 438/182 |
| 5,963,833 * | 10/1999 | Thakur | 438/677 |
| 5,972,183 * | 10/1999 | Krueger et al. | 204/298.07 |
| 5,981,351 * | 11/1999 | Nam et al. | 438/398 |

\* cited by examiner

Primary Examiner—Matthew Smith
Assistant Examiner—Granvill D Lee
(74) Attorney, Agent, or Firm—Fulbright & Jaworski

(57) ABSTRACT

Systems and methods are described for semiconductor wafer pretreatment. A method of increasing the selectivity of silicon deposition with regard to an underlying oxide layer during deposition of a silicon containing material by broadening a selective temperature of formation window for said silicon containing material by decreasing a lower temperature endpoint includes: providing a semiconductor wafer with the underlying oxide layer in a processing chamber; then pumping water from then processing chamber; and then depositing the silicon containing material on the semiconductor wafer. A step of seeding the semiconductor wafer can be conducted by exposing the semiconducotor wafer to a germanium containing gas. A chlorine containing precursor and/or hydrogen can be introduced into the processing chamber to increase the selectivity of the silicon containing material to the underlying oxide. The selective HSG temperature of formation window is widened. In addition, robustness with regard to changes in the reactor ambient and substrate condition, and selectivity with regard to underlying dielectric layers, are both improved.

54 Claims, 16 Drawing Sheets

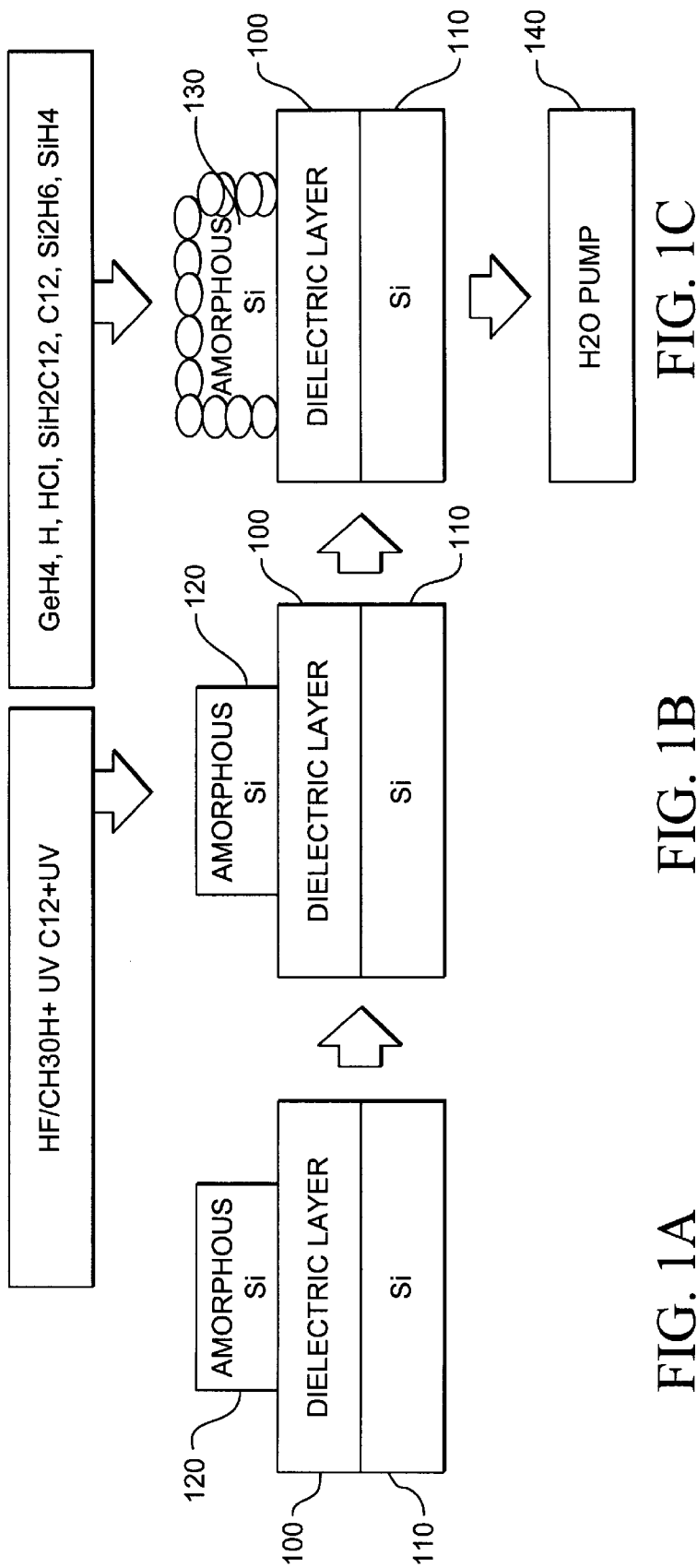

INCUBATION TIME OF Si ON THERMAL OXIDE WITH AND WITHOUT THE ADDITION OF HYDROGEN

60KX

SELECTIVE HEMISPHERICAL GRAIN SILICON DEPOSITION

BACKGROUND OF THE INVENTION

1. Field of the Invention

The invention relates generally to the field of fabricating integrated circuit devices. More particularly, the invention relates to methods of pretreating semiconductor wafers and/or selectively forming hemispherical grain silicon (HSG).

2. Discussion of the Related Art

As integrated circuit device dimensions continue to shrink, new processing methods are developed to facilitate fabrication of smaller device features. The basic driving forces motivating the reduction in device geometry are production cost and device performance. A new processing solution is expected to replace an existing process while simultaneously permitting cheaper and/or simpler production methods.

Dynamic random access memory (DRAM) manufacturers are interested in shrinking the capacitor size of each memory cell, while maintaining the same charge per cell. Retaining the same charge per cell while simultaneously shrinking the size of the capacitor requires an increase in the charge per unit area that the capacitor can hold. The charge per unit area of the capacitor can be increased by increasing the dielectric constant of the dielectric layer between the cell capacitor plates and/or increasing the surface area of the capacitor plates.

Prior art approaches to increasing the surface area of the capacitor plates include the use of a process called hemispherical grain silicon (HSG). HSG is described in detail in U.S. Pat. Nos. 5,385,863; 5,407,534; 5,634,974; 5,656,531; and 5,629,223, the entire contents of all of which are hereby expressly incorporated by reference into the present application as if fully set forth herein.

HSG is a process in which an amorphous silicon layer is heated to a temperature slightly below the one at which bulk crystallization occurs. At this intermediate temperature range, silicon atoms migrate along the surface and form clusters which are between 200 and 1200 angstroms in diameter. The silicon clusters are hemispherically shaped. A DRAM cell capacitor plate coated with HSG has more surface area per unit cell area compared to a cell of the same dimensions which is not coated by HSG. The ratio defined by the surface area per unit cell area of an HSG surface divided by that of a corresponding non-HSG surface is called the area enhancement factor (AEF). AEF values of 1.5–3.5 can be achieved using the HSG method.

Various methods of depositing HSG have been described. These methods include low pressure chemical vapor deposition (LPCVD), plasma enhanced chemical vapor deposition (PECVD), molecular beam epitaxy (MBE), and rapid thermal chemical vapor deposition (RTCVD). In order to form HSG on 3-dimensional structures, the HSG process must be performed selectively so that the hemispherical grains of silicon are formed only on the existing capacitor cell areas and not on the surrounding dielectric material. Selective deposition requires a contaminant-free amorphous silicon surface. Selective deposition also requires that the time the substrate is exposed to deposition gasses be substantially less than the time required for stable silicon nuclei to form on the dielectric layer.

The most widely used HSG formation processes include a seeding step in which the amorphous silicon substrate is exposed to a Si-containing source. During the seeding step, nucleation sites are formed at which the hemispherical grains of silicon grow. The seeding step is followed by an annealing step in which the substrate is heated. During the heating, silicon atoms migrate to the nucleation sites and HSG is formed.

However, a problem with this HSG technology is that it is difficult to maintain selectivity. Selectivity means that the HSG is deposited preferentially on some surfaces while it is substantially not deposited on other surfaces. In the prior art, the issue of selectivity is addressed by keeping the chemical reactor in which the HSG process is performed at a very low pressure or by adding fluorine-containing gasses during the deposition.

A significant disadvantage of keeping the reactor at a very low pressure is that the HSG process becomes highly pressure dependent. The very low pressure can cause severe fluctuations in quality and selectivity, depending on the amount of time during which the chamber has been exposed to vacuum.

A significant disadvantage of adding fluorine-containing gasses during the deposition is that fluorine is not a desirable substance on the surface of the amorphous silicon. The fluorine can interfere with both the migration of silicon atoms on the surface of the amorphous silicon and the HSG formation. Silicon atoms should be free to diffuse across the surface (migrate). Another disadvantage of using fluorine-containing gases during the deposition is that the fluorine can enhance dopant depletion in boron-doped electrodes. Therefore, what is needed is an approach to HSG that has better selectivity.

Another problem with this HSG technology is that quality and selectivity is degraded due to out-gassing of moisture from the underlying dielectric material during the HSG process. One approach to addressing this moisture out-gassing problem is to pump out the chamber for a longer period of time before commencing the HSG process. However, this approach has the significant disadvantage of increasing the total amount of time required to complete the overall HSG process, thereby reducing efficiency. A process chamber can only accommodate a given number of wafers at one time and the longer each process cycle takes, the fewer wafers can be processed per unit of time. Therefore, what is also needed is an approach to selectively forming HSG that has better efficiency.

Heretofore, the requirements of good selectivity, less process pressure dependence, unimpeded silicon migration, avoidance of dopant depletion, and efficiency referred to above have not been fully met. What is required is a solution that simultaneously addresses all of these requirements.

SUMMARY OF THE INVENTION

A primary goal of the invention is to provide one or more approaches to improving the robustness of a selective HSG process with regard to changes in the reactor ambient and substrate condition. Another primary goal of the invention is to provide one or more approaches to improving the selectivity of a HSG process with regard to underlying dielectric layers.

In accordance with these goals, there is a particular need for an approach that includes treating a semiconductor wafer and/or selectively depositing hemispherical grained silicon. Thus, it is rendered possible to simultaneously satisfy the above-discussed requirements of good selectivity, process pressure independence, unimpeded silicon migration, avoidance of dopant depletion, and increased efficiency, which, in the case of the prior art, are mutually contradicting and cannot be simultaneously satisfied.

A first aspect of the invention is implemented in an embodiment that is based on a method of treating a semiconductor wafer, said method comprising: contacting said semiconductor wafer with a mixture including HF and $CH_3OH$; and then contacting said semiconductor wafer with $Cl_2$ and simultaneously exposing said semiconductor wafer to a source of electromagnetic energy. A second aspect of the invention is implemented in an embodiment that is based on a method of increasing the selectivity of silicon deposition with regard to an underlying oxide layer during deposition of a hemispheric grain silicon material by broadening a selective temperature of formation window for said hemispheric grain silicon material by decreasing a lower temperature endpoint, said method comprising: contacting a semiconductor wafer with $Cl_2$ and simultaneously exposing said semiconductor to a source of electromagnetic energy. A third aspect of the invention is implemented in an embodiment that is based on a method of increasing the selectivity of silicon deposition with regard to an underlying oxide layer during deposition of a silicon containing material by broadening a selective temperature of formation window for said silicon containing material by decreasing a lower temperature endpoint, said method comprising: contacting a semiconductor wafer with $Cl_2$ and simultaneously exposing said semiconductor wafer to a source of electromagnetic energy. A fourth aspect of the invention is implemented in an embodiment that is based on a method of increasing the selectivity of silicone deposition with regard to an underlying oxide layer during a deposition of a silicon containing material by broadening a selective temperature formation window for said silicon containing material by decreasing a lower temperature endpoint, said method comprising: exposing a semiconductor wafer to a source of ultraviolet electromagnetic energy.

A fifth aspect of the invention is implemented in an embodiment that is based on a method of increasing the selectivity of silicon deposition with regard to an underlying oxide layer during deposition of a silicon containing material by broadening a selective temperature of formation window for said silicon containing material by decreasing a lower temperature endpoint, said method comprising: providing a semiconductor wafer with said underlying oxide layer in a processing chamber; then pumping water from said processing chamber; and then depositing said silicon containing material on said semiconductor wafer. A sixth aspect of the invention is implemented in an embodiment that is based on a method of increasing the selectivity of silicon deposition with regard to an underlying oxide layer during deposition of a silicon containing material by broadening a selective temperature of formation window for said silicon containing material by decreasing a lower temperature endpoint, said method comprising: providing a semiconductor wafer with said underlying oxide layer in a processing chamber; then heating said semiconductor wafer to a first temperature; then seeding said semiconductor wafer at said first temperature by exposing said semiconductor wafer to a germanium containing gas, optional followed by a silicon containing gas, or a combination of a germanium containing gas and a silicon containing gas; and then annealing said semiconductor wafer at a second temperature so as to grow said silicon containing material. A seventh aspect of the invention is implemented in an embodiment that is based on a method of increasing the selectivity of silicon deposition with regard to an underlying oxide layer during deposition of a silicon containing material by broadening a selective temperature of formation window for said silicon containing material by decreasing a lower temperature endpoint, said method comprising: providing a semiconductor wafer with said underlying oxide layer in a processing chamber; then heating said semiconductor wafer to a first temperature; then seeding said semiconductor wafer at said first temperature; introducing a chlorine containing precursor into said processing chamber during seeding in order to increase the selectivity of the silicon containing material to the underlying oxide layer; and then annealing said semiconductor wafer at a second temperature so as to grow said silicon containing material. A eighth aspect of the invention is implemented in an embodiment that is based on a method of increasing the selectivity of silicon deposition with regard to an underlying oxide layer during deposition of a silicon containing material by broadening a selective temperature of formation window for said silicon containing material by decreasing a lower temperature endpoint, said method comprising: providing a semiconductor wafer with said underlying oxide layer in a processing chamber; heating said semiconductor wafer to a first temperature; introducing hydrogen into said processing chamber in order to increase the selectivity of the silicon containing material to the underlying oxide; seeding said semiconductor wafer at said first temperature; and then annealing said semiconductor wafer at a second temperature so as to grow said silicon containing material.

These, and other, goals and aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference characters (if they occur in more than one view) designate the same parts. It should be noted that the features illustrated in the drawings are not necessarily drawn to scale.

FIGS. 1A–1C illustrate schematic views of a simple capacitor cell undergoing a series of process steps, representing an embodiment of the invention.

DESCRIPTION OF PREFERRED EMBODIMENTS

Figure 2C:
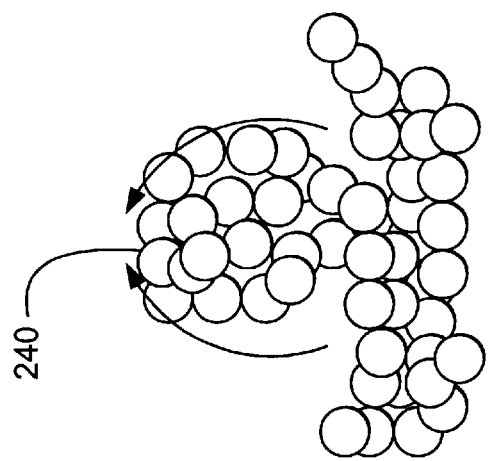
FIGS. 2A–2C illustrate schematic views of a formation sequence for hemispherical grained silicon (HSG), representing an embodiment of the invention.

The invention and the various features and advantageous details thereof are explained more fully with reference to the nonlimiting embodiments that are illustrated in the accompanying drawings and detailed in the following description. Descriptions of well known components and processing techniques are omitted so as not to unnecessarily obscure the invention in detail.

The context of the invention is semiconductor device fabrication, for example HSG and/or epitaxy. The invention includes a number of different techniques to decrease process sensitivity to the dielectric layer condition and the reaction chamber conditions. The processes that can be improved by the invention include HSG, deposition of amorphous silicon, deposition of polycrystalline silicon, deposition of SiGe, and deposition of SiGeC (e.g., epitaxy). The techniques can be used alone, or together in any combination, to effectively decrease the process sensitivity to the dielectric layer condition and the reaction chamber conditions. The invention can also utilize data processing methods that transform diagnostic signals from the chamber so as to actuate interconnected discrete hardware elements; for example, hardware elements adapted to change temperature, pressure, power, etc.

The invention includes subjecting amorphous silicon to a pretreatment process that includes exposure to a gas mixture including hydrofluoric acid (HF) and methanol ($CH_3OH$), optionally followed by exposure to a $Cl_2$ gas that is irradiated by electromagnetic energy (e.g., ultraviolet (UV) light), optionally followed by exposure to additional electromagnetic energy (e.g., UV). This pretreatment process can be conducted in a chamber that is separate from a subsequent process chamber, such as, for example, an HSG, epitaxy, or other (e.g., SiGe or Si) deposition process chamber. The HF and methanol gas mixture step removes native oxide from the amorphous silicon. The UV-chlorine step removes fluorine remaining on the surface of the amorphous silicon layer from the HF. The UV step helps to remove water before the step of seeding.

The invention includes a selective HSG deposition process that includes heating (ramping) an amorphous silicon layer up to a predetermined first process (seeding) temperature, then flowing seed gas onto the layer for a predetermined time, then stopping the seed gas flow and heating the wafer to a higher predetermined second process (annealing) temperature for a predetermined time. The amorphous silicon can be undoped, or alternatively doped with phosphorous, boron, arsenic, etc. The selective HSG deposition process can include the use of a water pump and/or water getter; the use of GeH4 for seeding; the addition of $H_2$ before and/or during seeding; the addition of Cl containing gases before and/or during seeding; and/or a low process pressure.

Referring to FIGS. 1A–1C, the pretreatment process and selective HSG deposition process will be described in the context of a particular microelectronic structure. Referring to FIG. 1A, a dielectric layer 100 is formed on a silicon wafer substrate 110 using conventional patterning methods. An amorphous silicon layer 120 is then patterned on the dielectric layer 100 to form a capacitor cell structure.

Referring to FIG. 1B, the wafer is subjected to the pretreatment process. The pretreatment includes exposing the amorphous silicon layer 120 and portions of the dielectric layer 100 to a first gas mixture. The first gas mixture includes hydrofluoric acid (HF) and methanol ($CH_3OH$). In some embodiments of the invention, the amorphous silicon layer 120 and the portions of the dielectric layer 100 are then exposed to a second gas mixture. The second gas mixture includes $Cl_2$. The second gas mixture can be activated by irradiation with ultraviolet (UV) band energy. In some embodiments of the invention, the amorphous silicon layer 120 and the portions of the dielectric layer 100 are then be exposed to additional UV energy, in the absence of a specific gas mixture.

Referring now to FIG. 1C, the selective HSG formation approach includes a two step process. The two step process includes a first step of seeding and a second step of HSG growth. As noted above, the seeding takes place at a first predetermined temperature and the HSG growth takes place at a second higher predetermined temperature. Typical seeding substances include $Si_2H_6$ and/or $GeH_4$. It can be advantageous to add molecular hydrogen before and/or during the seeding step. For example, sources of hydrogen can include molecular hydrogen, HCl and/or $SiH_2Cl_2$. It can also be advantageous to add chlorine containing precursor gases before and/or during the seeding step. Sources of chlorine can include, for example, molecular chlorine, HCl and/or $SiH_2Cl_2$.

Still referring to FIG. 1C, an HSG layer 130 is formed on the amorphous silicon layer 120. It can be advantageous to remove water from the processing chamber in which the seeding and growth steps take place. The water can be removed with an $H_2O$ pump 140.

Figure 2B:
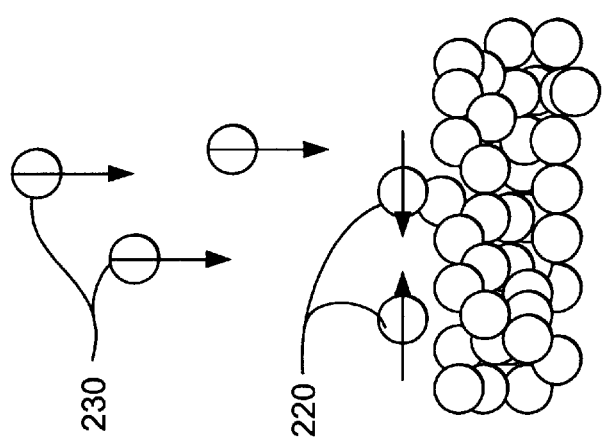
Figure 2A:
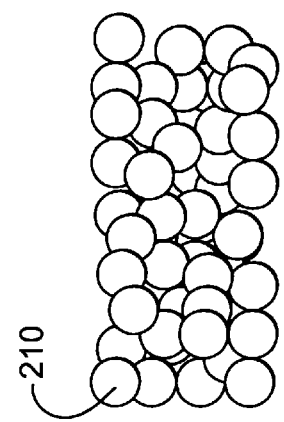

Referring to FIGS. 2A–2C, an HSG formation sequence is depicted in more detail. Referring to FIG. 2A, the HSG formation sequence begins with a starting amorphous silicon material 210. Referring to FIG. 2B, during the seeding step, silicon atoms 220 migrate across the surface of the amorphous silicon material 210. The seeding step can utilize $GeH_4$ or a silicon containing species 230 with optional addition of atomic hydrogen and/or chlorine containing species. Referring to FIG. 2C, during the annealing step, additional migration of silicon atoms results in the growth of HSG grain(s) 240. Thus, the annealing step results in substantial HSG formation.

Figure 3:
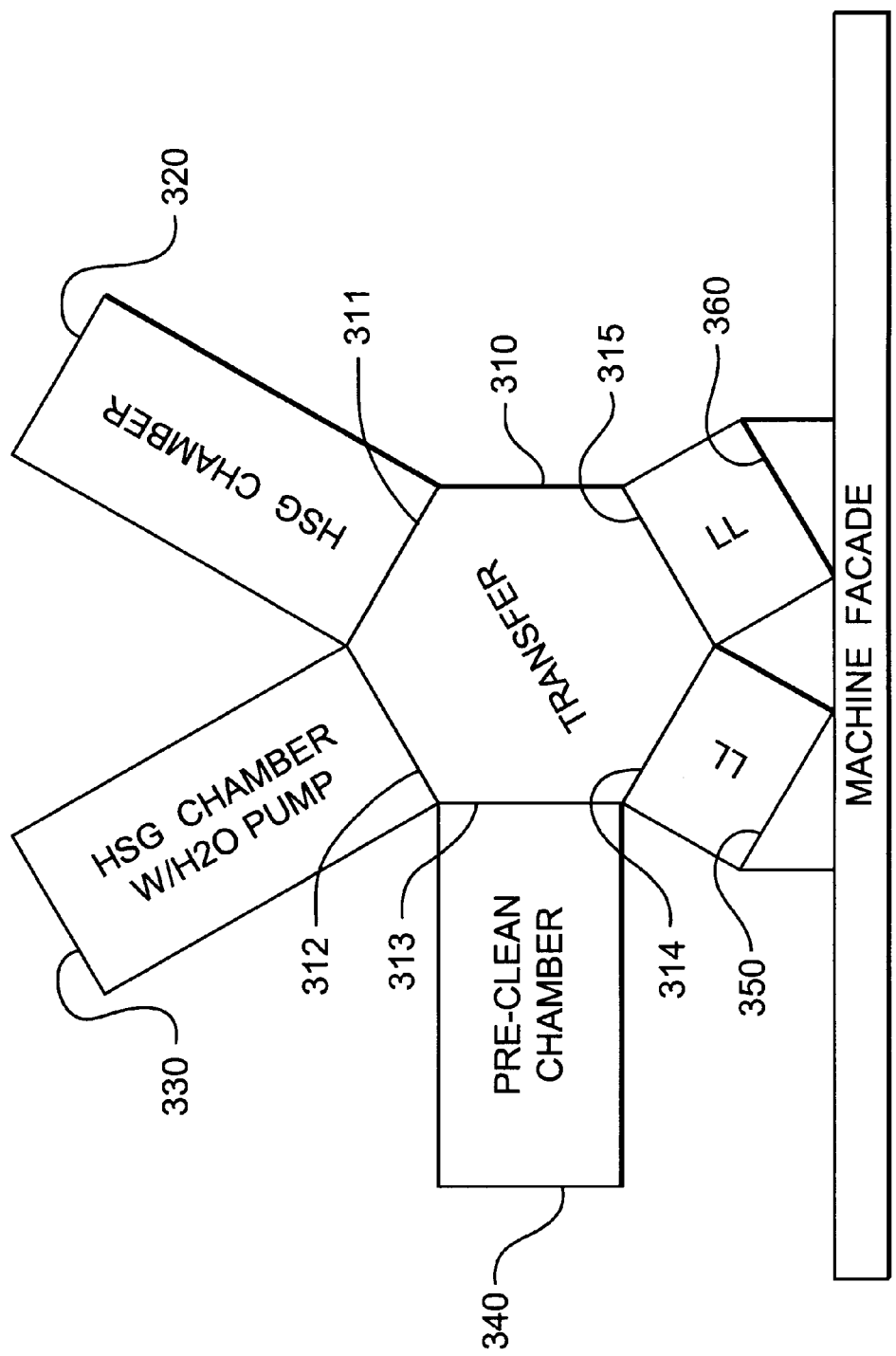
FIG. 3 illustrates a schematic view of the layout of an HSG cluster tool, representing an embodiment of the invention.

Referring to FIG. 3, an HSG cluster tool is depicted. The HSG cluster tool includes a central transfer chamber 310. In this example, the transfer chamber 310 has six structural walls (i.e., facets), five of which are being utilized in the example illustrated in FIG. 3. A first facet 311 couples the transfer chamber 310 to a first HSG chamber 320. A second facet 312 couples the transfer chamber 310 to a second HSG chamber 330. A third facet 313 couples the transfer chamber 310 to a pre-clean chamber 340. A fourth facet 314 couples the transfer chamber to a first load lock 350. A fifth facet 315 couples the transfer chamber 310 to a second load lock 360. Both the first load lock 350 and the second load lock 360 are coupled to a machine facade 330 through which semiconductor wafers can be provided, and removed.

Figure 4:
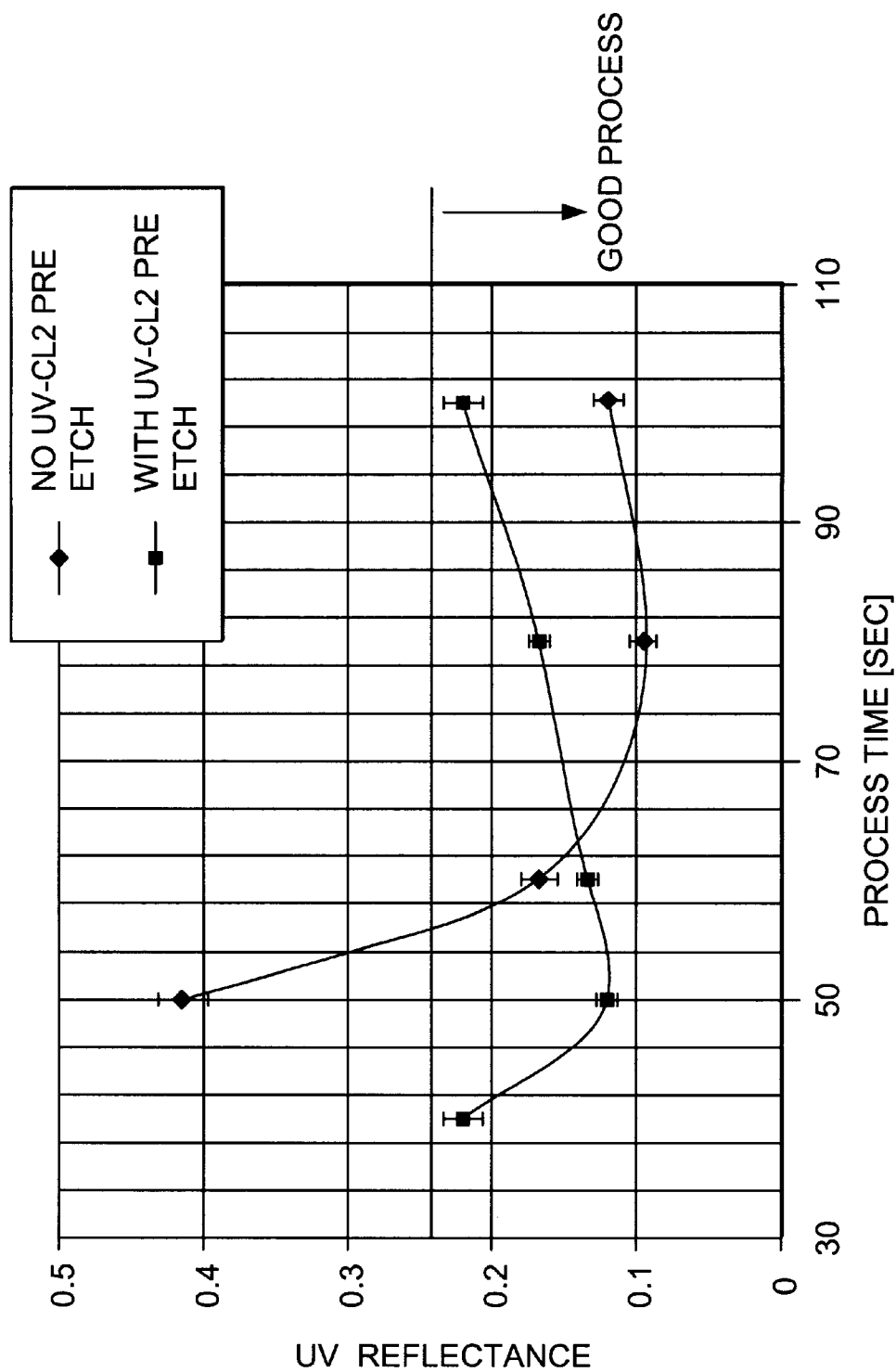
FIG. 4 illustrates UV (ultraviolet) reflectance as a function of seeding time for HSG wafers, both with (square data points) and without (round data points) UV $Cl_2$ pre-treatments, representing embodiments of the invention.
Figure 5A:
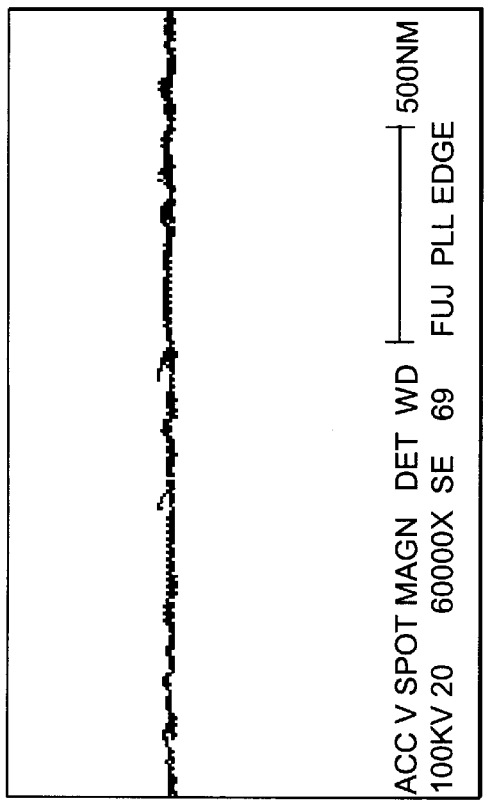
FIGS. 5A–5B illustrate SEM images of HSG, both without (5A) and with (5B) pre-treatment of UV-$Cl_2$ pre-treatment, representing embodiments of the invention.
Figure 5B:
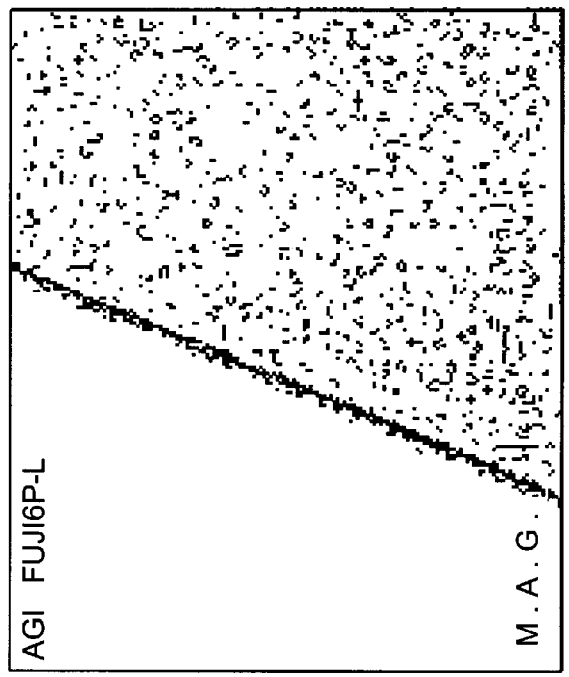

Referring to FIGS. 4 and 5A–5B, the UV-$Cl_2$ process removes native oxide from the amorphous silicon surface (by etching the underlying silicon) and removes fluorine remaining on the surface of the amorphous silicon layer from the HF step. The UV-Cl2 process also creates pits in the surface of amorphous silicon and these pits facilitate nucleation. This creates surface conditions in which a subsequent HSG process can proceed with little or no silicon containing seeding step.

Referring to FIG. 4, the advantageous effect of the UV-$Cl_2$ step on the HSG process window is shown via measurement of UV reflectance. UV reflectance is a measure of the quality of the HSG. Reflectance decreases as the HSG grows larger and denser. The lower the UV reflectance, the denser the HSG grains. An amorphous silicon wafer starts out with a reflectance value of approximately 0.5 and as the amorphous silicon surface converts to HSG the reflectance falls to approximately 0.15. A reflectance characterization of 0.25 or below indicates that seeding is sufficient.

Still referring to FIG. 4, the flow of disilane was approximately 6 sccm, the seed temperature was approximately 615° C. and the anneal temperature was approximately 650° C. It can be appreciated that wafers that received a UV-$Cl_2$ pretreatment converted to HSG over a wider range of seeding time. More specifically, using the UV-$Cl_2$ pretreatment permits conversion of amorphous silicon to HSG in a shorter process time. Therefore, pre-treating the wafer with UV-$Cl_2$ improved the selectivity as defined by the ratio of incubation time on the dielectric to seeding time for HSG formation. The use of the UV-$Cl_2$ pretreatment did not affect the incubation time of silicon on silicon oxide.

Selectivity means preferential deposition of the silicon on top of the underlying silicon layer (e.g., amorphous structure) and not on the surrounding dielectric material. Increasing selectivity or improving selectivity means improving (i.e., increasing) the ratio of the time for deposition on the oxide (incubation time) to the time needed to complete a good process on the silicon (process time). The larger the ratio between the incubation time versus the process time, the better. For example, if 100 seconds is required in order to get nucleation on the oxide, and only 10 seconds is required for the process to be completed on the silicon, then the ratio is 100/10, which is 10. The higher this ratio, the better. Improving selectivity means increasing this ratio.

Referring now to FIGS. 5A–5B, SEM data proves that the UV-$Cl_2$ pretreatment of amorphous silicon results in higher grain density formation compared to a wafer with no UV-$Cl_2$ treatment. The wafer in FIG. 5A did not receive any UV-$Cl_2$ pretreatment. Referring to FIG. 5A, the oxide is the darker, homogeneous region at the top of the image. The wafer in FIG. 5B received a UV-$Cl_2$ pretreatment. Referring to FIG. 5B, the oxide is the darker, homogeneous region at the left of the image. Even though the wafer shown in FIG. 5B received 50% less irradiation time with $Si_2H_6$, it can be appreciated that there is a higher density of HSG shown in FIG. 5B than in FIG. 5A.

Referring to FIGS. 6–9, the invention includes inserting the wafer, after the UV-$Cl_2$ and/or UV pretreatment, into a process chamber which is pumped by a turbomolecular pump that is fitted with an apparatus that selectively freezes water vapor molecules at temperatures of from approximately 213° C. to approximately 113° C. The presence of water in the chamber requires the processing temperature to be higher. Too much water in the chamber acts as an HSG inhibitor.

Figure 6:
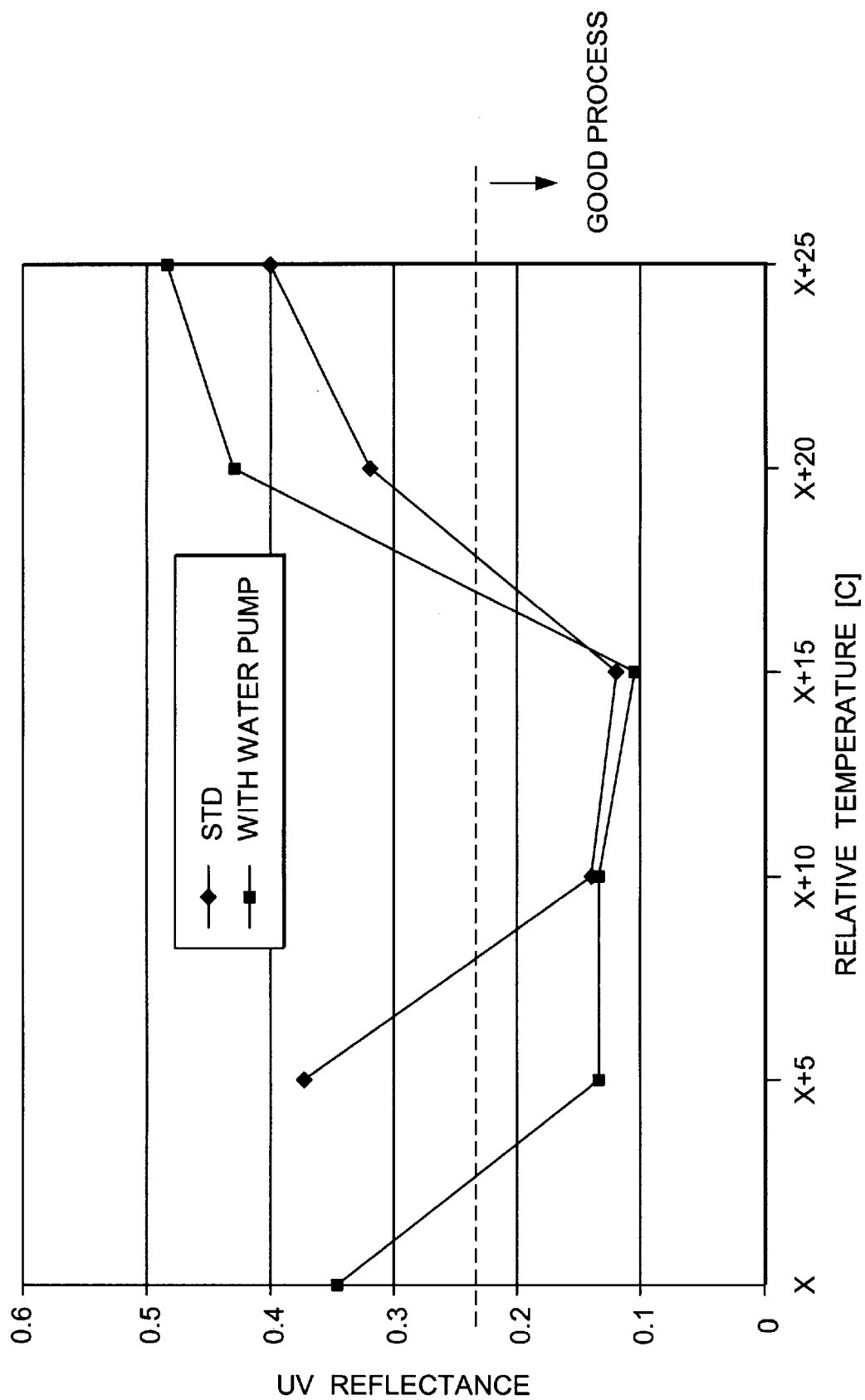
FIG. 6 illustrates UV reflectance as a function of relative temperature, both with (square data points) and without (round data points) the use of a water pump in the process chamber, representing embodiments of the invention.

Referring to FIG. 6, the reflectance of HSG layers for different processing temperatures is shown, both with and without the activation of a water pump in the process chamber. Fitting the turbomolecular pump with the water pump advantageously reduces the temperature range in which HSG can be formed. FIG. 6 shows comparative UV reflectance measurements of an HSG layer formed in a chamber that had an activated water pump vs. HSG formed in the same chamber without an activated water pump. It can be appreciated that the use of a water pump enables HSG to form at lower temperatures compared to the standard process. Achieving lower HSG formation temperatures is desirable, since HSG process has an upper temperature limit due to bulk crystallization of the silicon layer. In addition to reducing HSG formation temperature, the water pump increased the incubation time of silicon on thermal oxide. The incubation time is defined as the time that passes from the initialization of the gas flow until stable silicon nuclei appear on the silicon oxide.

Figure 7:
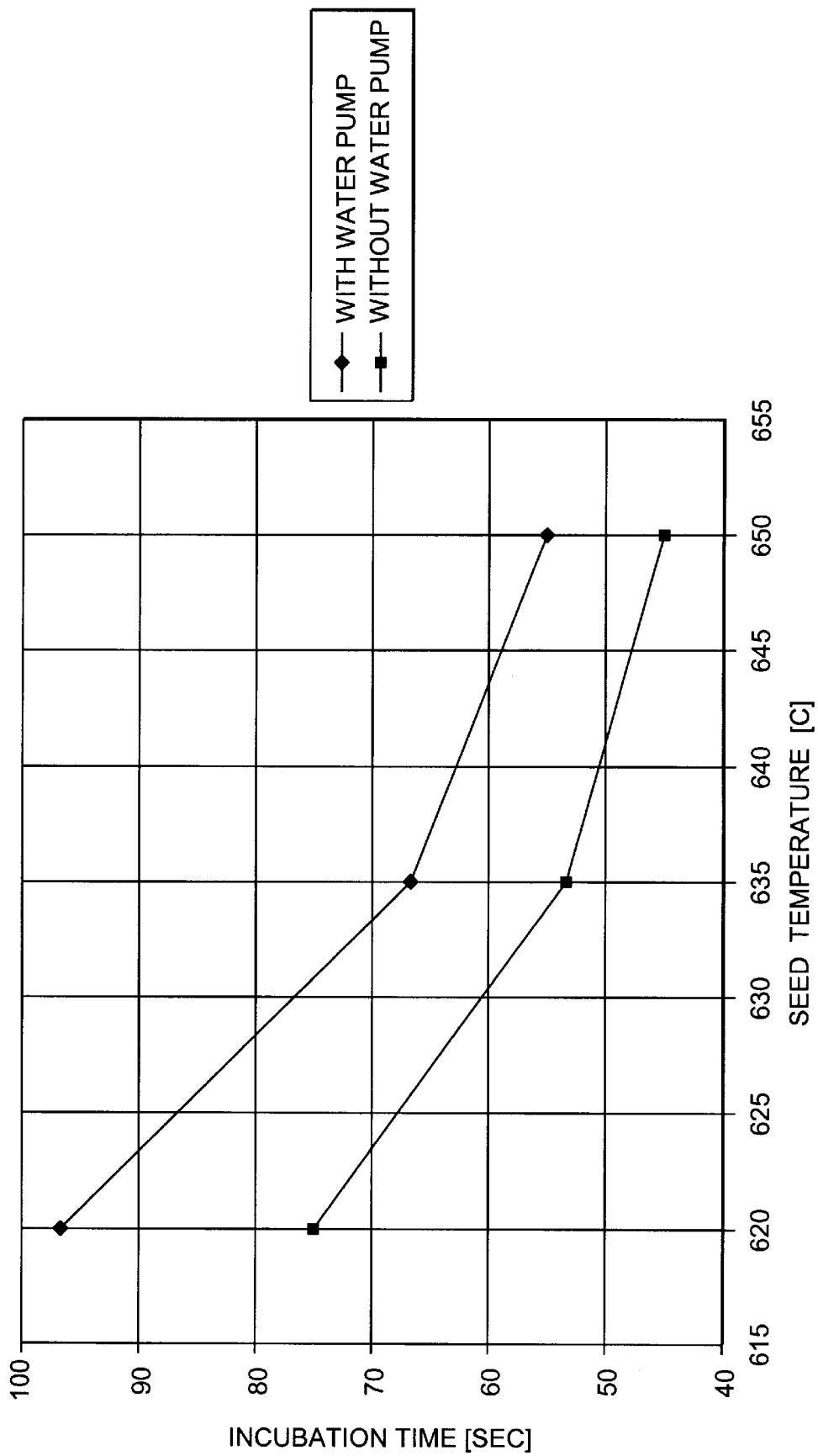
FIG. 7 illustrates silicon incubation time on an oxide as a function of relative temperature, both with (diamond data points) and without (square data points) water pump activation, representing embodiments of the invention.

Referring now to FIG. 7, fitting the turbomolecular pump with the water pump also advantageously increases the incubation time of silicon on the dielectric layer. FIG. 7 shows the measured incubation time of silicon on silicon oxide with, and without, the activation of a water pump. The seed flow used was approximately 25 sccm. Both the decrease of the minimum HSG formation temperature and the increase in the incubation time of silicon on silicon oxide result in a more robust and stable process. It is believed that the presence of water causes OH groups to be present on the $SiO_2$, thereby reducing selectivity because OH termination promotes silicon nucleation on the oxide.

Figure 8:
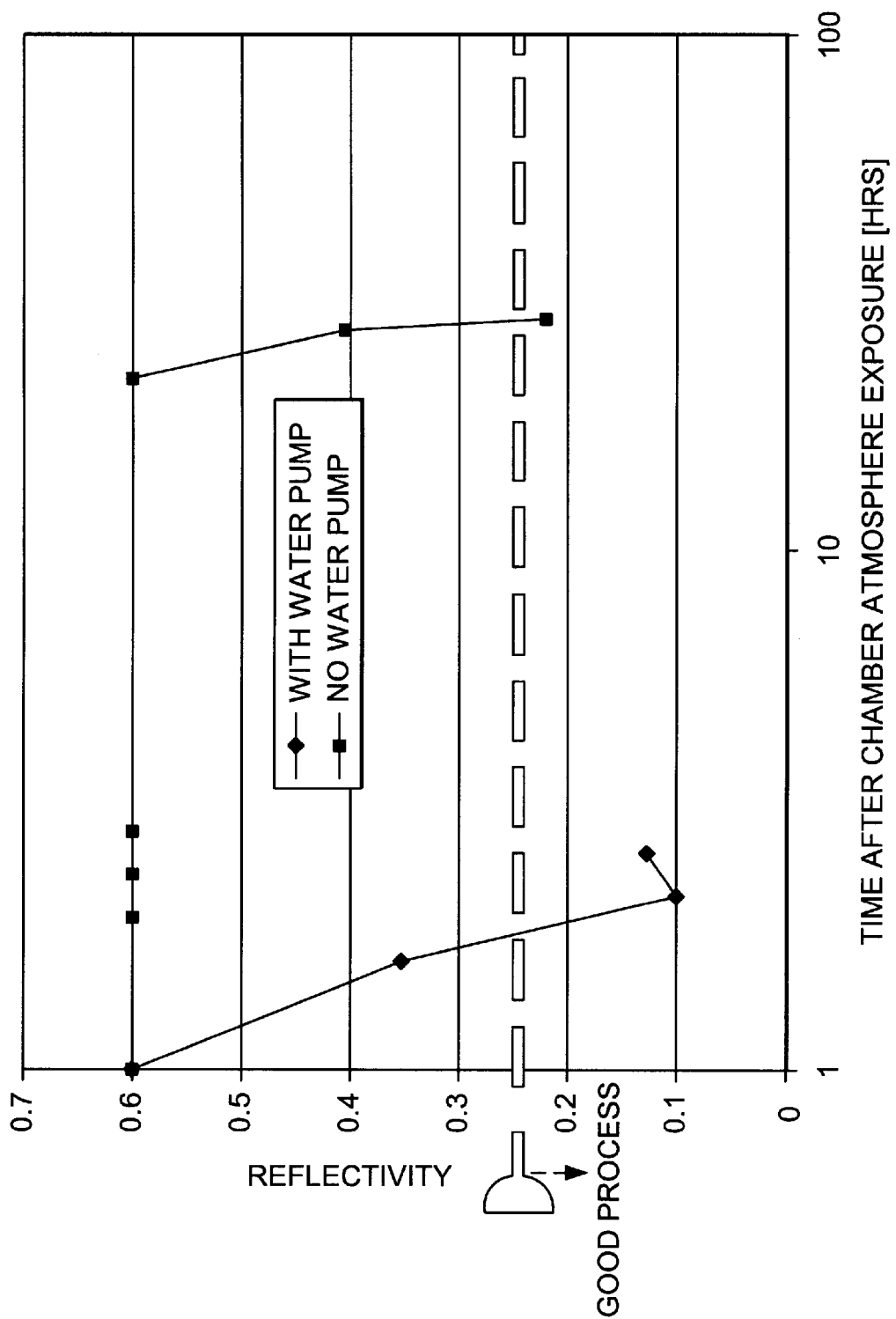
FIG. 8 illustrates reflectivity as a function of time after chamber exposure to atmosphere (chamber recovery time), both with (diamond data points) and without (square data points) water pump use, representing embodiments of the invention.

Referring now to FIG. 8, fitting the turbomolecular pump with this apparatus also reduces the chamber recovery time after exposure to atmosphere. The use of the water pump can significantly reduce the recovery time of the process chamber after exposing it to ambient. In this case, the UV reflectance of wafers subjected to the HSG process was measured at several times after closing the chamber. The chamber is considered recovered at the point at which the UV reflectance falls below 0.25. The recovery time is defined as the time that passes between closing the chamber after ambient exposure and the time in which running a standard HSG process results in converting a standard amorphous silicon wafer to HSG with a UV reflectance less than 0.25.

Figure 9:
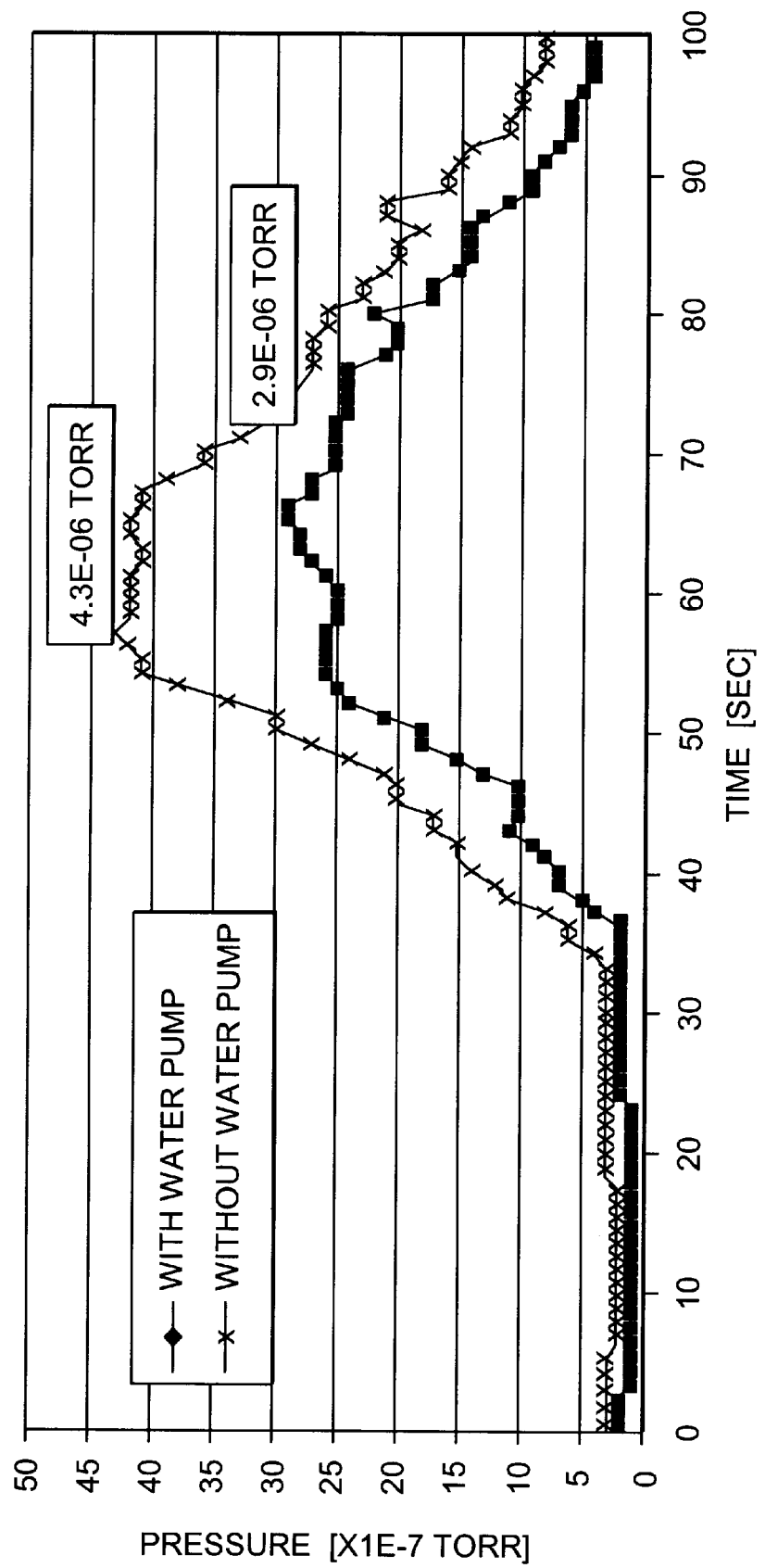
FIG. 9 illustrates pressure as a function of time during wafer heating in the process chamber, both with (square data points) and without (X shaped data points) water pump activation, representing embodiments of the invention.

Referring now to FIG. 9, there is an improvement in the process and recovery time due to the removal of water vapor from the chamber when using this apparatus. FIG. 9 shows the pressure increase in the process chamber during the heating of a wafer with and without the activation of a water pump. When the water pump is activated, the maximum pressure rise is reduced compared to heating the wafer without the water pump activated.

Figure 10:
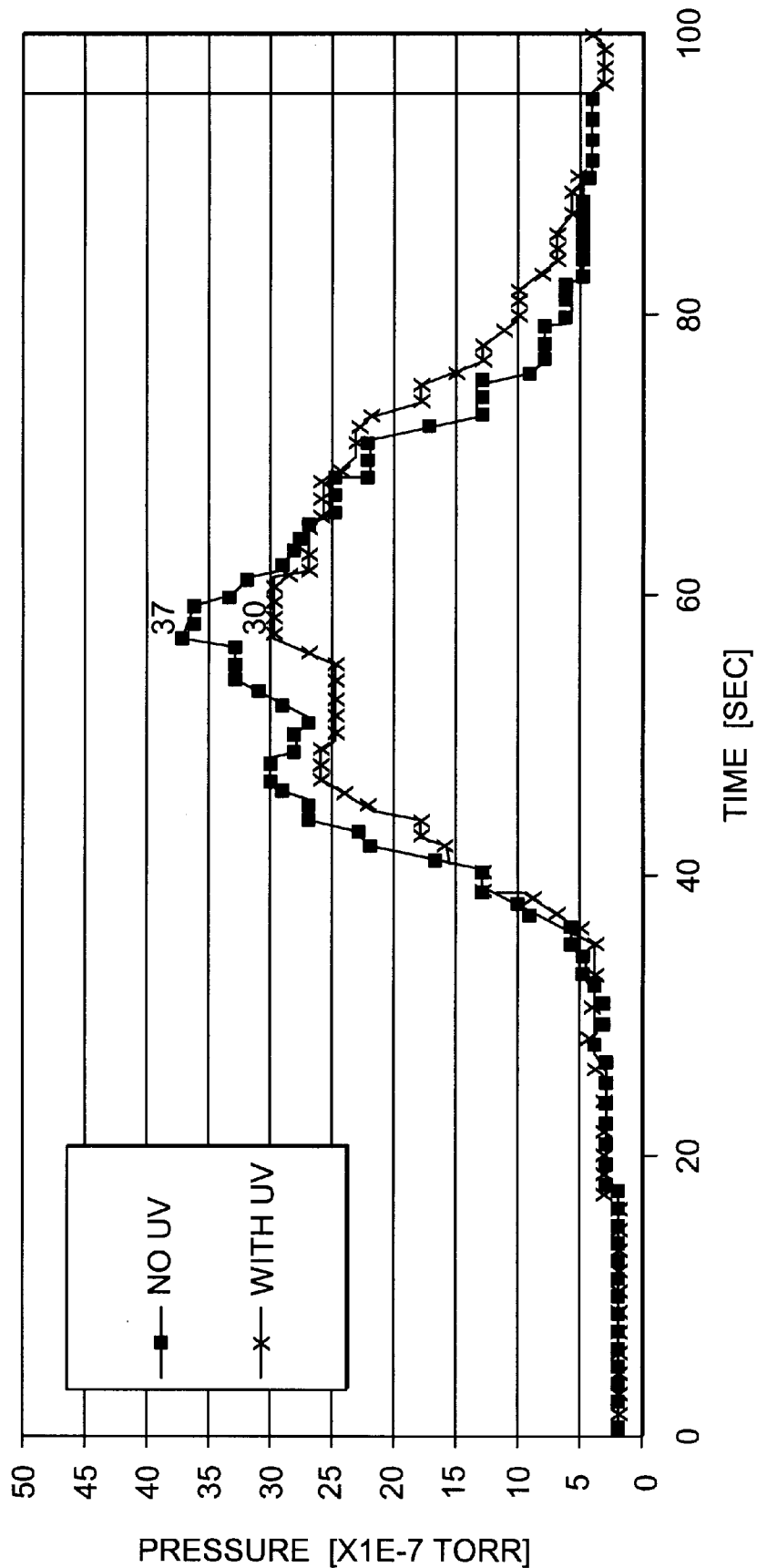
FIG. 10 illustrates pressure as a function of time during wafer heating in the process chamber, both with (X shaped data points) and without (square data points) pre-treatment with UV light, representing embodiments of the invention.

Referring now to FIG. 10, the invention includes following the UV-$Cl_2$ process with a UV-only step in which the substrate is exposed to UV radiation, which effectively releases moisture from the dielectric layer before the substrate is subjected to the HSG process in another chamber. The advantage of the UV-$Cl_2$ and UV dry steps is that they do not result in significant heating of the wafer, and therefore do not damage the amorphous silicon layer or change its state prior to the formation of the HSG.

The invention includes providing the process chamber with a chemical gettering material which can selectively pump water vapor. For example, an alloy of zirconium can be used to absorb water when heated. The absorbed water is released with the alloy cools (after the HSG process is complete). This apparatus can be used instead of or in addition to the chamber that is pumped by the turbomolecular pump.

Referring now to FIGS. 11A–11D, removing the native oxide from the silicon without exposing the wafer to atmosphere prior to the HSG process advantageously results in a wider process window for the formation of HSG compared to the standard method of removing native oxide. FIGS. 11A–11D show various comparisons of wafers pretreated with HF/$CH_3OH$ and wafers treated with standard wet cleaning procedure. The standard wet clean process consists of dipping the wafers in an HF/$H_2O$ solution with a concentration ratio of approximately 1:100 for 1–2 min.

Figure 11A:
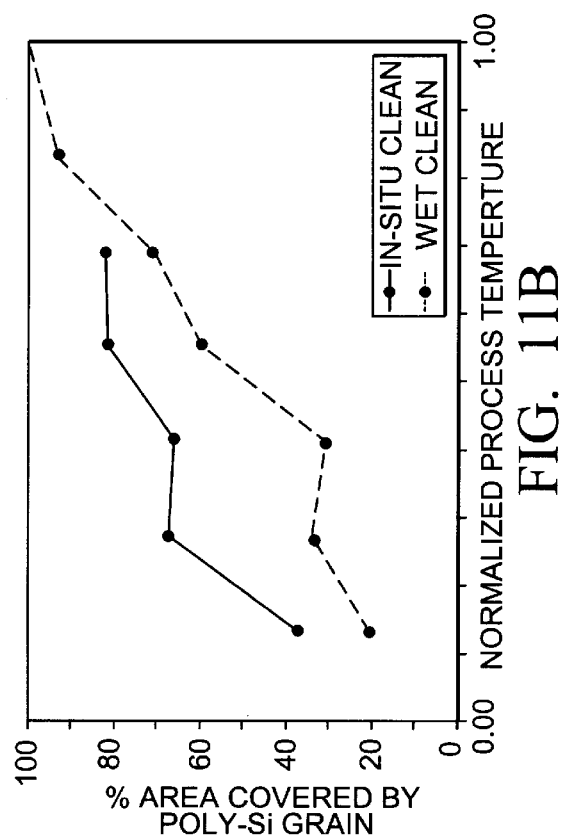
FIG. 11A illustrates average HSG grain height as a function of normalized process temperature, both for wafers cleaned with in situ vapor phase HF/Methanol cleaning (solid lines) and for wafers cleaned with wet cleaning (dashed lines), representing embodiments of the invention.

FIG. 11A shows average HSG grain height as a function of normalized process temperature. FIG. 11A demonstrates that the in situ HF/$CH_3OH$ pretreatment results in larger grains achieved at a lower process temperature.

Figure 11B:
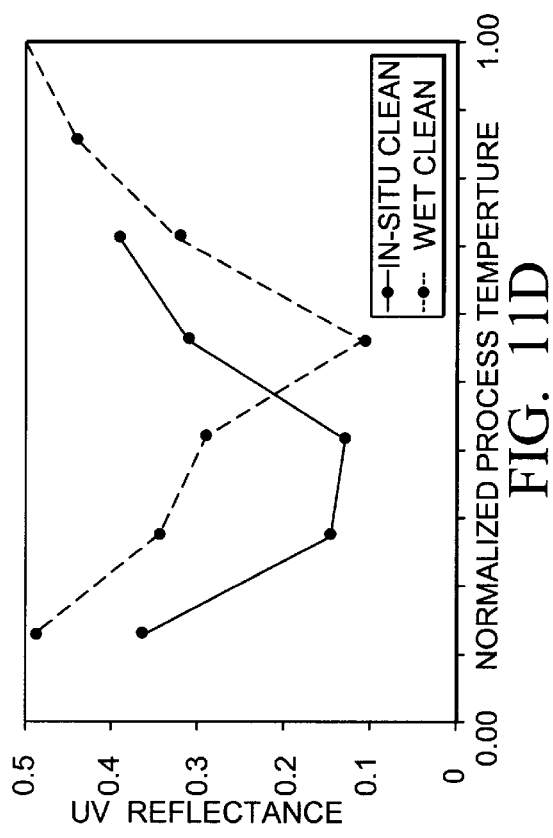
FIG. 11B illustrates percent area covered by polycrystalline silicon grains as a function of normalized process temperature, both for wafers cleaned with in situ vapor phase HF/Methanol cleaning (solid lines) and for wafers cleaned with wet cleaning (dashed lines), representing embodiments of the invention.

FIG. 11B shows average substrate area covered by polycrystalline silicon grains as a function of normalized process temperature. FIG. 11B demonstrates that the in situ HF/CH3OH pretreatment results in larger area covered by HSG achieved at a lower process temperature than the standard clean. It is better to have a higher percent area covered by the poly-silicon grains.

Figure 11C:
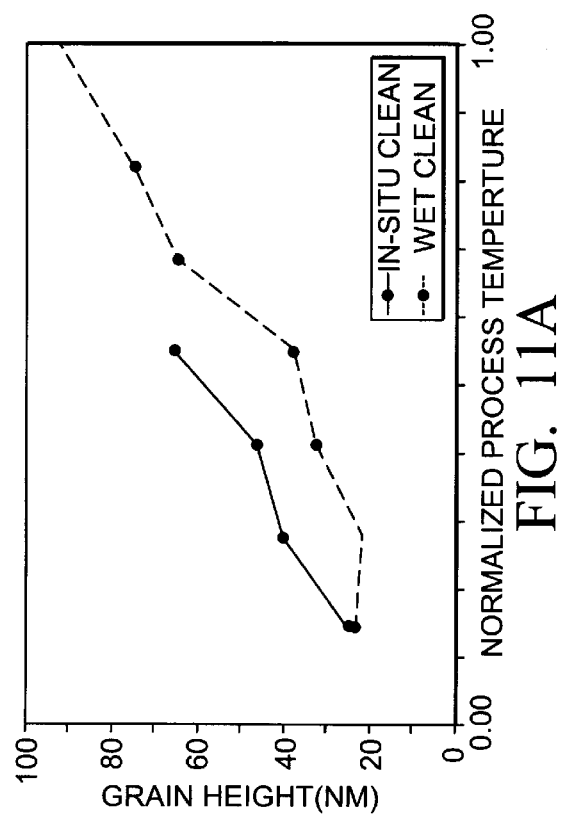
FIG. 11C illustrates polycrystalline silicon grain density (grains per square micron) as a function of normalized process temperature, both for wafers cleaned with in situ vapor phase HF/Methanol cleaning (solid lines) and for wafers cleaned with wet cleaning (dashed lines), representing embodiments of the invention.

FIG. 11C, shows grains per square micron as a function of normalized process temperature. FIG. 11C demonstrates that the in situ HF/$CH_3OH$ pretreatment results in a lower grain density at most temperatures compared to a standard wet clean. This is due to the fact that the grains are larger compared to ones formed without in situ HF/$CH_3OH$ clean. The sudden drop off indicates wetting.

Figure 11D:
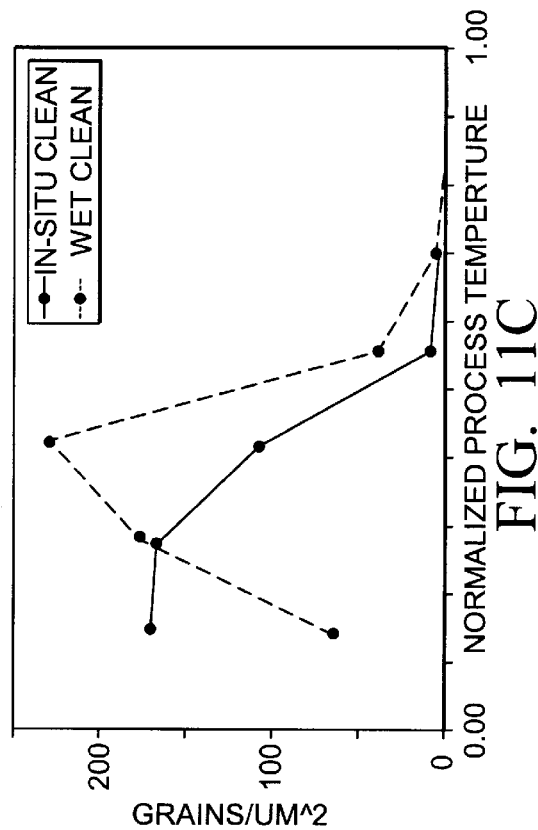
FIG. 11D illustrates UV reflectance as a function of normalized process temperature, both for wafers cleaned with in situ vapor phase HF/Methanol cleaning (solid lines) and for wafers cleaned with wet cleaning (dashed lines), representing embodiments of the invention.

FIG. 11D shows UV reflectance as a function of normalized process temperature. FIG. 11D demonstrates that the in situ HF/$CH_3OH$ pretreatment results in low UV reflectance of wafers over a wider range of HSG process compared to the standard wet clean. UV reflectance is a measure of the quality of the HSG. An amorphous silicon wafer starts out with values of 0.5, and as it converts to HSG, the reflectance falls to 0.15. The lower the UV reflectance, the denser the HSG grains. Achieving lower HSG formation temperatures is desirable, since HSG process has an upper temperature limit due to bulk crystallization of the silicon layer.

Seeding with $GeH_4$

Figure 12A:
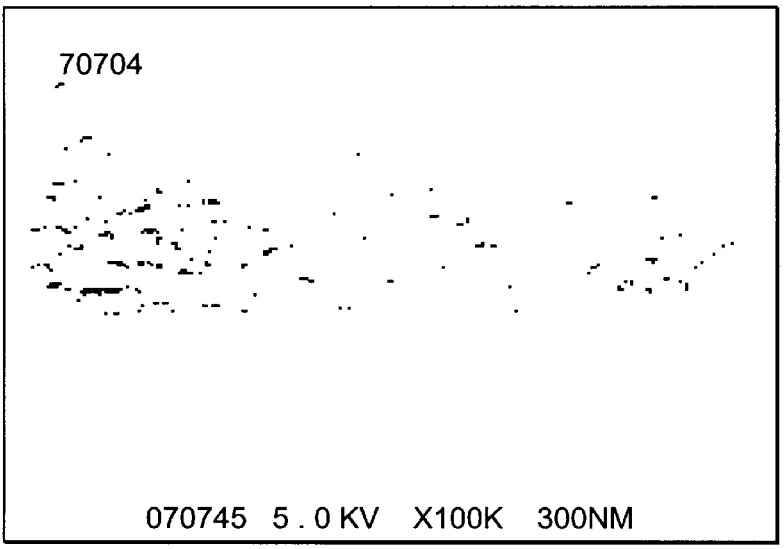
FIG. 12A illustrates HSG formed by seeding with $GeH_4$ at 625° C., representing an embodiment of the invention.
Figure 12B:
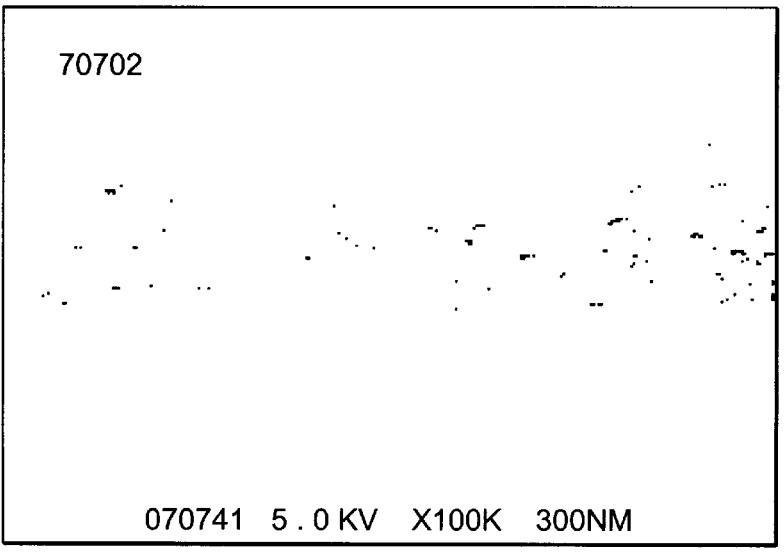
FIG. 12B illustrates HSG formed by seeding with $GeH_4$ at 655° C., representing an embodiment of the invention.
Figure 12C:
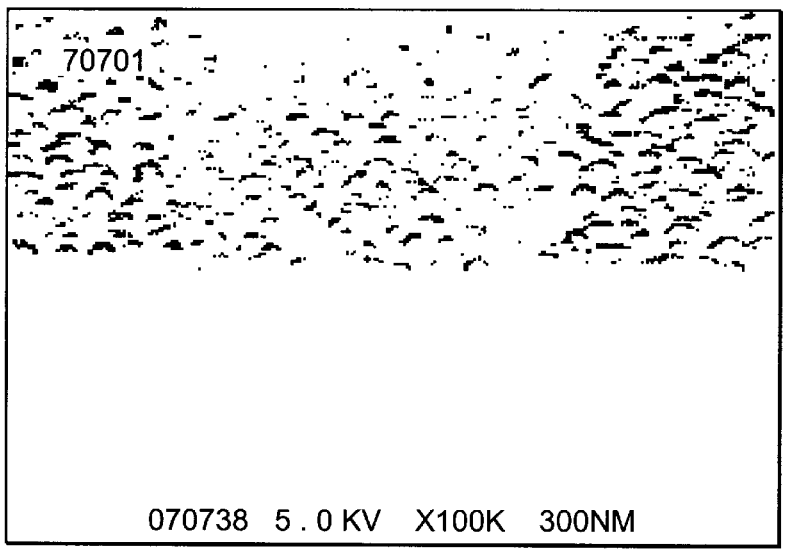
FIG. 12C illustrates HSG formed by seeding with $Si_2H_6$ at 655° C., representing an embodiment of the invention.

Referring to FIGS. 12A–12C, the invention includes performing the seeding step with $GeH_4$ gas instead of, or in addition to, silicon-containing sources. $GeH_4$ is also known to effectively etch silicon oxide and can further reduce any native oxide formed on the amorphous silicon layer. FIG. 12A shows HSG formed by seeding with $GeH_4$ at a temperature of from approximately 585° C. to approximately 595° C. FIG. 12B shows HSG formed by seeding with $Si_2H_6$ at a temperature of from approximately 625° C. to approximately 635° C. for approximately 50 seconds, followed by annealing at a temperature of from approximately 655° C. to approximately 665° C. FIG. 12C shows HSG formed by seeding with $GeH_4$ at a temperature of from approximately 625° C. to approximately 635° C. for approximately 50 seconds, followed by annealing at a temperature of from approximately 655° C. to approximately 665° C. The seeding density with $GeH_4$ is lower compared to $Si_2H_6$, but the grain shape is better with $GeH_4$. Different pressure conditions are needed to optimize $GeH_4$ seeding at low temperatures. The advantage of using $GeH_4$ instead of a silicon-containing source is that the $GeH_4$ can nucleate on the amorphous silicon layer at lower temperatures, and this will widen the temperature process window for HSG formation by further separating the temperature ranges required for seeding from the temperature ranges required for growing the HSG.

The invention includes adding hydrogen in molecular and/or atomic form prior to and/or during the seeding step. Atomic hydrogen reduces the native oxide formed on the amorphous silicon, and can lower the sensitivity of the process to the chamber ambient.

The invention includes adding small amounts of chlorine containing precursors to the seeding step, such as $Cl_2$, HCl or $SiH_2Cl_2$. The chlorine will serve to etch some of the silicon deposited during the seeding step, effectively increasing the incubation time on the dielectric layer and increasing the process selectivity.

Figure 13:
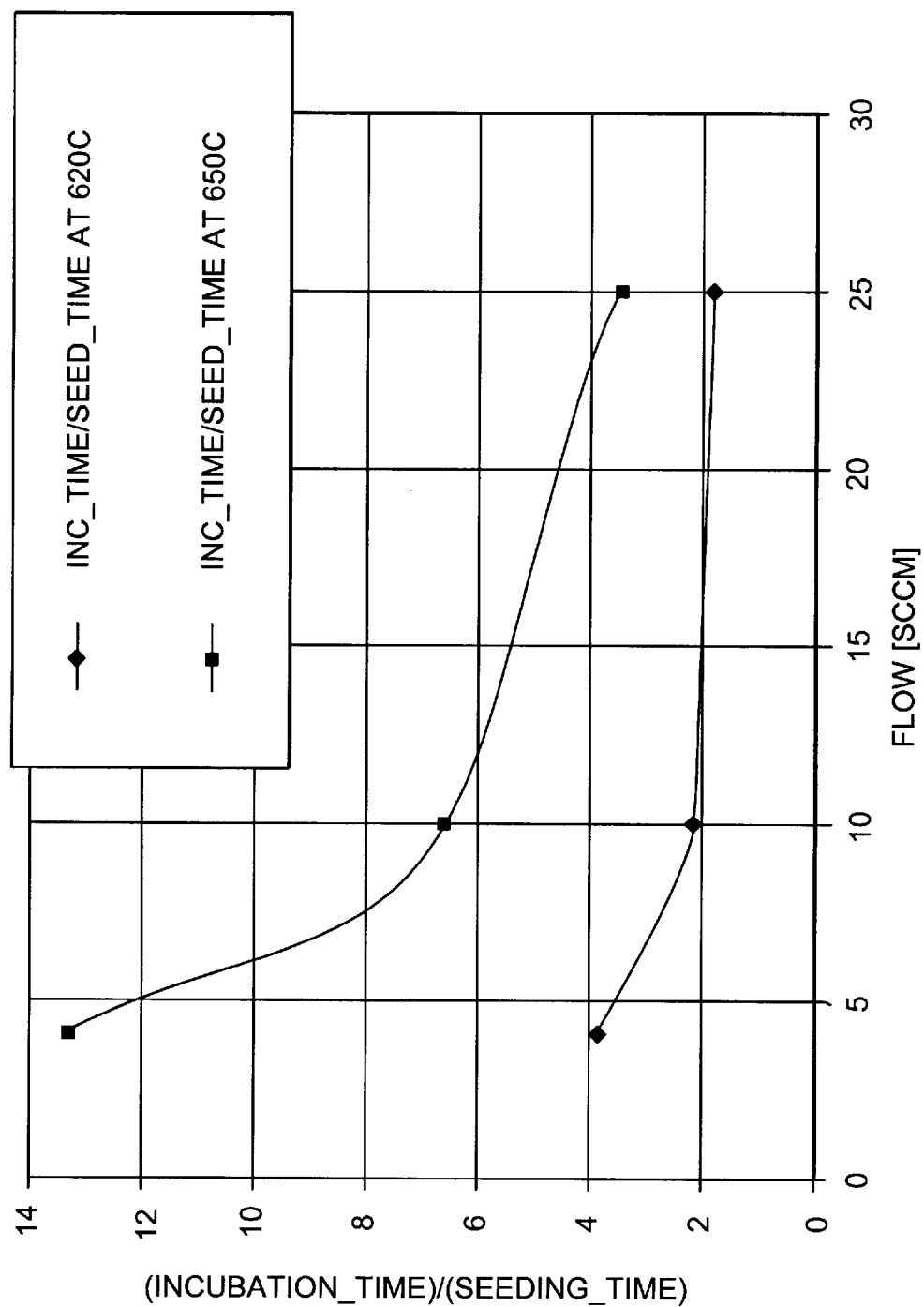
FIG. 13 illustrates incubation time divided by seeding time (selectivity) on thermal oxide layer as a function of flow rate, both at 620° C. (diamond data points) and 650° C. (square data points), representing embodiments of the invention.

Referring to FIG. 13, the invention includes lowering the process pressure by lowering the total flow of the irradiating gas so as to increase the selectivity. FIG. 13 shows incubation time divided by seeding time (selectivity) as a function of seeding gas flow rate in units of standard cubic centimeter (sccm). This shows the effect of seeding flow on the selectivity of silicon deposition with regard to a thermal oxide layer. This effect is more pronounced at higher seeding temperatures. Fine-tuning of the HSG process parameters will result in achieving better selectivity.

Figure 14:
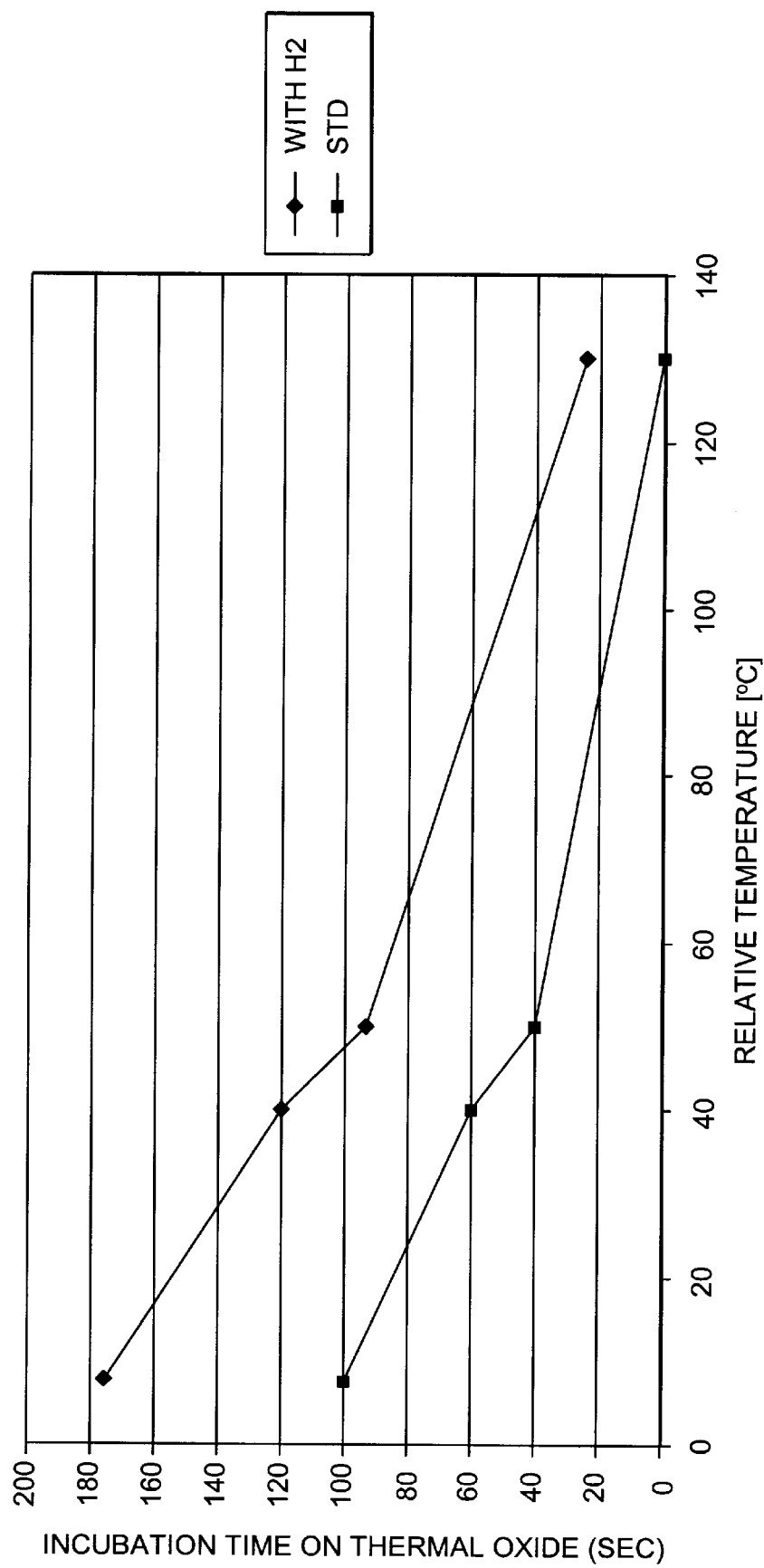
FIG. 14 illustrates incubation time of Si on thermal oxide as a function of relative temperature, both with (diamond data points) and without (square data points) the addition of hydrogen, representing embodiments of the invention.

FIG. 14 shows the incubation time of silicon on silicon oxide with and without the addition of molecular hydrogen. Several methods of supplying atomic and molecular hydrogen to the reactor can be used, such as supply of molecular hydrogen gas, flowing hydrogen gas over a hot filament to create atomic hydrogen, initiating a remote hydrogen plasma, or using UV light to create atomic hydrogen. The atomic hydrogen can be used to etch native oxide layers from the silicon surface through hydrogen reduction reaction.

Pre-Clean Module

Figure 15:
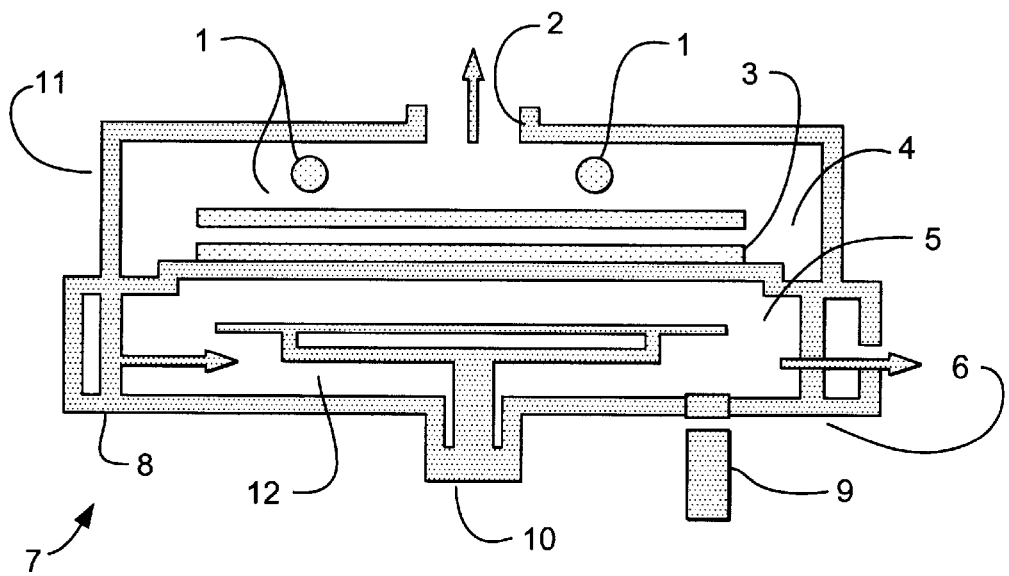
FIG. 15 illustrates a schematic interior view of a pre-clean module, representing an embodiment of the invention.

Referring to FIG. 15, in a first part of an HSG formation sequence, a wafer is inserted into a pretreatment chamber 7. Several pretreatment processes that are embodiments of the invention can be run in this chamber and the invention includes all combinations thereof. The pretreatment chamber can be referred to as a dry clean module (DCM). The pretreatment can be preformed in any chamber that has the basic capability to be substantially compatible with HF, $CH_3OH$ and $Cl_2$, heat the wafer surface up to approximately 200° C. controllably, irradiate the wafer with UV light, and maintain process pressures between approximately 0.5 Torr and approximately 200 Torr.

The chamber 7 is made out of $Al_2O_3$ that is resistant to HF vapor attack. A wafer 5 is supported by a spindle 12 that is supported by a magnetic levitation device 10. The spindle 12 can rotate at a predetermined speed. Gas is injected through an injection plate 8. The injection plate 8 can be an $Al_2O_3$ plate with holes drilled in it. The gas flows across the wafer 5 and can be pumped out through a pumping plate 6. A sapphire window 4 sits on top of the chamber 7 and provides a vacuum seal, while enabling both UV and IR radiation to shine into the chamber 7. The wafer 5 can be heated using IR lamps 1 arranged in cross-hatched configuration above the sapphire window 4. The wafer temperature is measured using an optical pyrometer 9. UV radiation is provided by a UV lamp 3 situated above the sapphire window 4. The UV and IR lamps are enclosed in a protective casing 11. The casing 11 can be pumped out through a conduit 2.

Pretreatment of the wafer using $HF/CH_3OH$ includes inserting the wafer into the DCM. At first, a pressure is stabilized by flowing $CH_3OH$ vapor and $N_2$ gas into the chamber through the injection plate 8 at pressures between 0.5 Torr and 200 Torr and heating the wafer with IR lamps 1 to temperatures between room temperature and 200° C. Wafer heating can be done by using direct contact with a hot surface or indirect method by IR or other forms of radiation. After the gas pressure is stabilized, HF gas flows into the chamber and etching of silicon oxide begins. Oxide etch stops by stopping the HF gas flow and pumping the DCM down to base pressure. The Pretreatment of wafers in the DCM using $HF/CH_3OH$ chemistry significantly improves the process window for HSG formation.

It can be appreciated that the methods of pre-treating the wafer prior to HSG formation are also applicable to any selective silicon deposition. For example, selective doped or undoped amorphous silicon deposition, selective doped or undoped poly silicon deposition, and selective doped or undoped Si, SiGe, or SiGeC epitaxy growth.

Figure 17A:
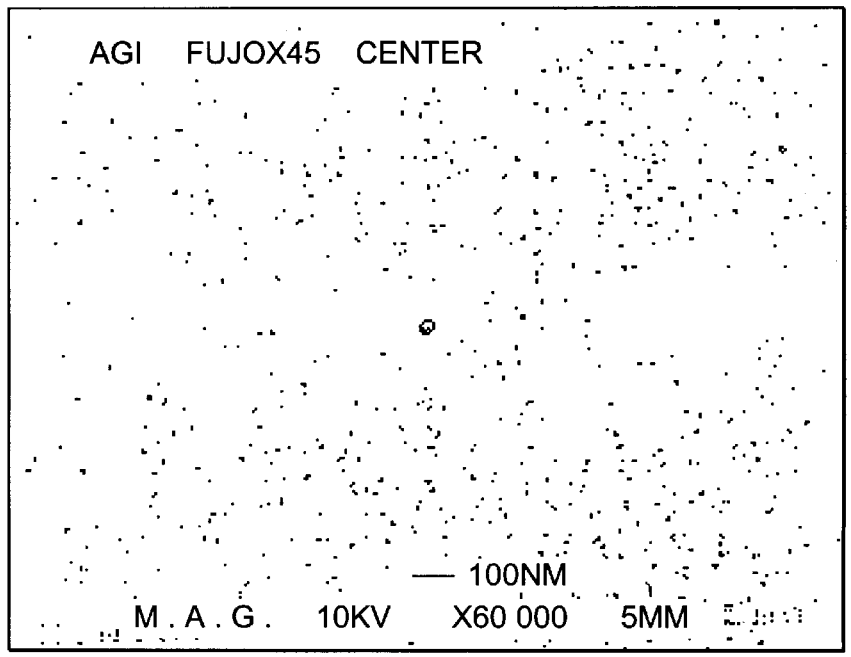
FIG. 17A illustrates silicon nucleation on thermal oxide with UV exposure, representing an embodiment of the invention.
Figure 17B:
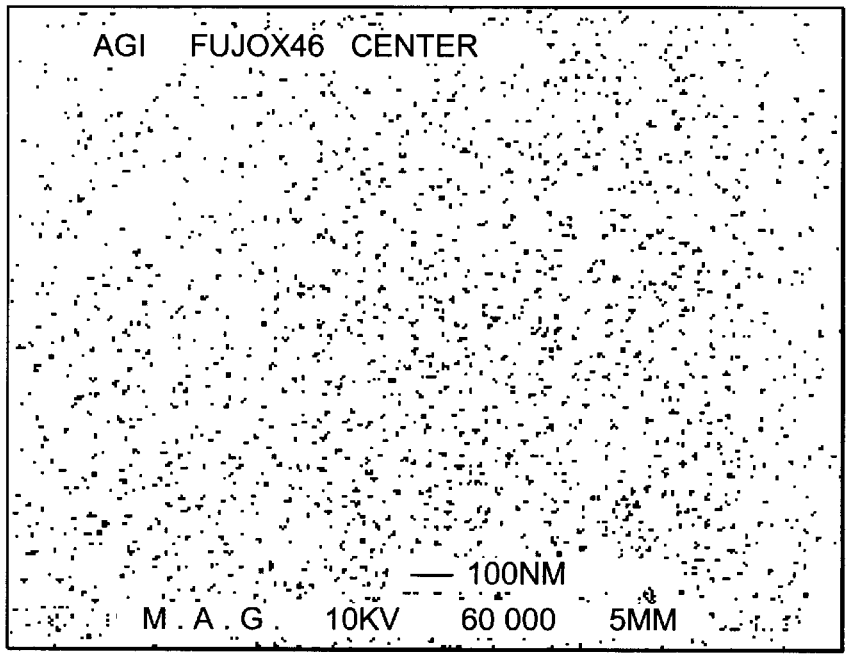
FIG. 17B illustrates silicon nucleation on thermal oxide without UV exposure, representing an embodiment of the invention.

Still referring to FIG. 15, pretreatment in UV consists of inserting a wafer into the DCM and turning on the UV light 3 for approximately 10–200 seconds. The chamber 7 is pumped to a pressure between 200 Torr and $1^{-8}$ Torr during the UV irradiation. As seen in FIG. 10, subjecting the wafer to UV light reduces the amount of out-gassing during the first HSG process step. Referring to FIGS. 17A and 17B, SEM data shows that silicon nucleation on thermal oxide is reduced after subjecting the wafer to UV light.

Still referring to FIG. 15, pretreatment using UV and Cl2 consists of inserting the wafer into the DCM. The wafer is heated using the IR lamps 1 to a temperature between room temperature and 150° C. $Cl_2$ is flowed into the chamber at a pressure of approximately 1–200 Torr for approximately 5–200 sec., the $Cl_2$ flow and the lamps 1 are turned off, and the chamber is evacuated to a base pressure.

Treatment of wafers prior to HSG formation step can include of any combination of the steps listed above, i.e., UV irradiation, UV $Cl_2$ treatment and $HF/CH_3OH$ treatment. In addition, the invention includes combining one, or more, of the steps listed above with any other processes.

CVD Module

Several procedures and modifications can be made to the HSG process chamber in order to improve the HSG process. The improvements described in this document can be applied to any reactor that has the ability to controllably heat a silicon wafer to temperatures of 500–850° C. at pressures between $1^{-8}$ and 100 Torr and flow any silicon containing Hydride.

Figure 16:
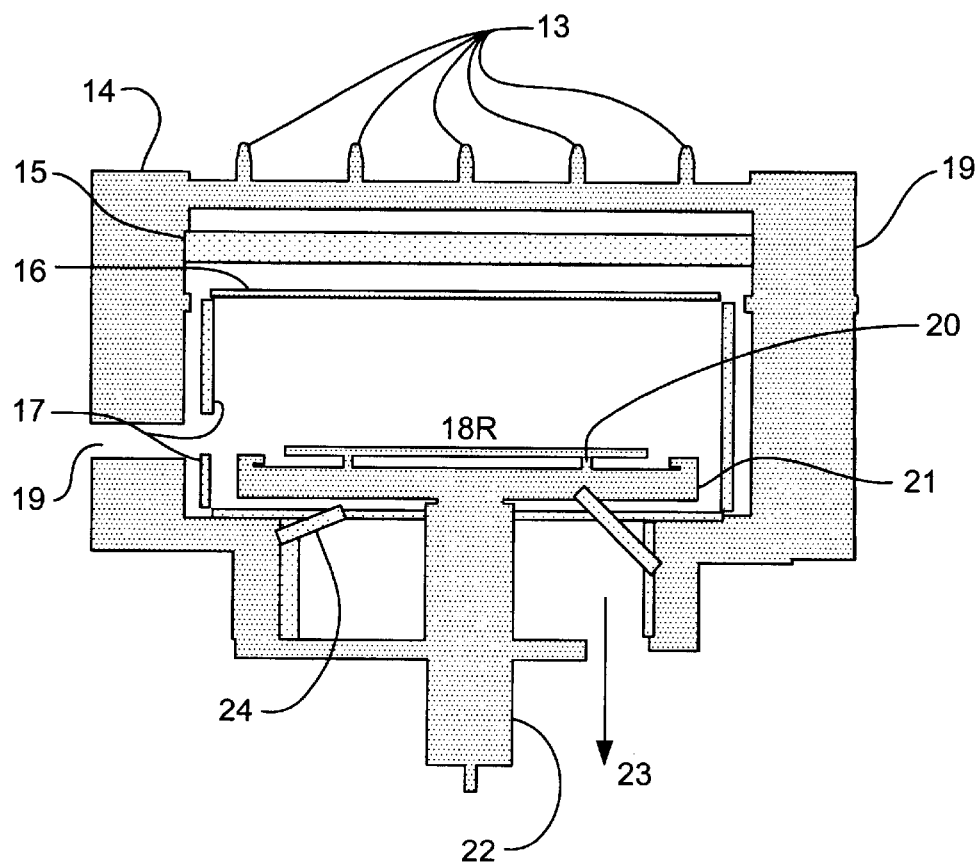
FIG. 16 illustrates a schematic interior view of a chemical vapor deposition (CVD) chamber, representing an embodiment of the invention.

Referring to FIG. 16, an example of such an HSG process chamber (reactor) is shown. Heat is provided to the wafer 18 by IR lamps 13. A quartz window 15 separates the chamber from ambient air and is transparent to the IR radiation. The lamps are situated in a water-cooled and air-cooled heater assembly 14. The chamber walls are lined with quartz 17 for easy cleaning. Gas is introduced through injection ports 19, flows through a quartz showerhead 16 to the wafer and pumped out through a pumping port 23. The wafer is supported by a pedestal 21, which also serves as part of the temperature measurement device. Lift pins 20 are used to elevate the wafer from the support pedestal for wafer transport. A fiber optic line 22 transmits an optical signal from the wafer to a detector. This signal is used to determine the wafer temperature.

The presence of oxidizing gasses in the process chamber before or during the HSG process will inhibit the formation of HSG by forming a silicon oxide layer on the silicon surface, inhibiting surface migration of silicon atoms. Oxidizing gasses are mainly traces of oxygen and water vapor. Oxidizing gasses can also promote nucleation of silicon on the dielectric layer and reduce the selectivity of the HSG process. It was found that by reducing oxygen and water vapor from the process chamber, the HSG process window will become wider. Silicon deposition selectivity to the underlying dielectric layer will improve, and the recovery time of the chamber after exposing it to ambient will be reduced. Various methods could be used to remove oxygen and water vapor from the process chamber. One method described in this document is the use of a series of metal fins cooled by a gas to a temperature of less than 150° K. The series of metal fins can be inserted on the pumping line below the pump port 23. The gas that is pumped from the chamber passes over the metal fins and the oxygen and water vapor is frozen on the cooled metal surfaces and removed from the chamber. The cooled surfaces can be isolated from the process chamber with an isolation valve so as not to expose the metal surfaces to the process gasses during the HSG formation. A second method for water vapor removal is the use of a metal alloy that absorbs oxygen and water vapor when heated to a certain activation temperature. This metallic alloy can absorb large quantities of water vapor. The metal alloy pump can be placed in another chamber or on the pump line. The metal alloy pump can also be isolated from the process chamber with an isolation valve. Another method of water vapor removal could be use of UV and/or IR light to periodically bake out the chamber and reduce the water vapor contamination. Use of any of the above methods would be referred to in this document as the use of a water pump.

The HSG process parameters can be fine-tuned in order to increase the selectivity of the silicon deposition to the underlying oxide. Selectivity is defined as the ratio between the incubation time and the optimal HSG seed time. The selectivity of the HSG process is plotted in FIG. 13 for different silicon seeding temperatures as a function of the seed gas flow. It can be shown that the selectivity of the HSG process improves as the seeding temperature is increased. Decreasing the seed gas flow increases the selectivity of the HSG process. A combination of seed flow reduction with changing seed temperature can be used to enhance the selectivity of the process. As stated before, increasing the HSG seed temperature is not desirable due to bulk crystallization of the silicon.

Another method of reducing the minimum HSG formation temperature is to use a different seed gas, which enables the creation of silicon nucleation sites at a lower temperature compared to the silicon-containing Hydrides. Seeding with a Ge-containing precursor can allow for a reduction in the HSG seeding temperature due to the formation of a silicon-Ge bond at a lower temperature than that of silicon-silicon. Ge-containing gas can also be used to etch away trace oxide layers on the amorphous silicon layer. FIG. 12 shows formation of HSG with the use of $GeH_4$ as a seeding source. A combined seeding step using Ge-containing gas at a low temperature followed by an additional short seed step with a silicon-containing Hydride can also be used.

Silicon is adsorbed to the silicon oxide layer by attachment to a dangling silicon bond. Reducing the amount of dangling bonds by Hydrogen passivation is offered as a way to increase the silicon selectivity during the HSG formation process. Hydrogen is desorbed from the oxide and the amorphous silicon surfaces of the wafer at temperatures exceeding 500° C. By supplying atomic and/or molecular hydrogen to the surface of the wafer prior to and during the HSG seeding step, the amount of desorbed hydrogen is reduced and the selectivity can be increased.

Practical Applications of the Invention

A practical application of the invention that has value within the technological arts is the selective deposition of HSG to increase the surface area of a capacitor. Further, the invention is useful in conjunction with the formation of HSG structures on surfaces where selective deposition of HSG is difficult, such as, for example, where the portion of the surface that is not to undergo deposition includes moisture-laden CVD silicon oxides. The methods described to improve the selective HSG formation would also be applicable to any selective silicon deposition application, including but not limited to selective doped or undoped amorphous silicon deposition, selective doped or undoped polycrystalline silicon deposition, and selective doped or undoped Si, SiGe, and SiGeC epitaxial growth. There are virtually innumerable uses for the invention, all of which need not be detailed here.

Advantages of the Invention

The invention can be cost effective and advantageous for at least the following reasons. The invention widens the selective HSG temperature of formation window. The invention improves the robustness of selective HSG with regard to changes in the reactor ambient and substrate condition. The invention improves the selectivity of a HSG process with regard to underlying dielectric layers.

All the disclosed embodiments of the invention described herein can be realized and practiced without undue experimentation. Although the best mode of carrying out the invention contemplated by the inventors is disclosed above, practice of the invention is not limited thereto. Accordingly, it will be appreciated by those skilled in the art that the invention may be practiced otherwise than as specifically described herein.

For example, the individual components need not be formed in the disclosed shapes, or assembled in the disclosed configuration, but could be provided in virtually any shape, and assembled in virtually any configuration. Further, the individual components need not be fabricated from the disclosed materials, but could be fabricated from virtually any suitable materials. Further, although the pretreatment chamber, HSG process chamber, and/or epitaxy process chamber described herein can be a physically separate module, it will be manifest that any one, two, or all, of these chambers may be integrated into the apparatus with which they are associated. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. A method of increasing the selectivity of silicon deposition with regard to an underlying oxide layer during deposition of a silicon containing material by broadening a selective temperature of formation window for said silicon containing material by decreasing a lower temperature endpoint, said method comprising:

providing a semiconductor wafer with said underlying oxide layer in a processing chamber; then pumping water from said processing chamber with a water pump located in said processing chamber; and then depositing said silicon containing material on said semiconductor wafer.

2. The method of claim 1, wherein pumping water from said processing chamber includes heating an alloy of zirconium located within said processing chamber.

3. The method of claim 1, wherein pumping water from said processing chamber includes cooling a cryotrap located within said processing chamber.

4. The method of claim 1, wherein said silicon containing material is selected from the group consisting of hemispherical grain silicon, amorphous silicon, polycrystalline silicon, SiGe, and SiGeC.

5. The method of claim 1, wherein depositing said silicon containing material includes:
heating said semiconductor wafer to a first temperature; then
seeding said semiconductor wafer at said first temperature; and then
annealing said semiconductor wafer at a second temperature so as to grow said silicon containing material.

6. The method of claim 5, wherein seeding includes exposing said semiconductor wafer to a germanium containing gas.

7. The method of claim 6, wherein said germanium containing gas includes $GeH_4$.

8. The method of claim 1, further comprising:
contacting said semiconductor wafer with $Cl_2$ and simultaneously exposing said semiconductor wafer to a source of ultraviolet energy, before depositing said silicon containing material on said semiconductor wafer.

9. The method of claim 8, further comprising:
exposing said semiconductor wafer to ultraviolet energy, after contacting said semiconductor wafer with $Cl_2$ and simultaneously exposing said semiconductor to said source of ultraviolet energy.

10. The method of claim 8, further comprising contacting said semiconductor wafer with a mixture including HF and $CH_3OH$, before contacting said semiconductor wafer with $Cl_2$ and simultaneously exposing said semiconductor to said source of ultraviolet energy.

11. The method of claim 5, further comprising:
adding hydrogen to said processing chamber, before seeding said semiconductor wafer at said first temperature.

12. The method of claim 5, further comprising:
adding hydrogen to said processing chamber, during seeding said semiconductor wafer at said first temperature.

13. The method of claim 5, further comprising:
adding a chlorine containing precursor to said processing chamber, during seeding said semiconductor wafer at said first temperature.

14. A semiconductor wafer processed by a method according to claim 1.

15. A method of increasing the selectivity of silicon deposition with regard to an underlying oxide layer during deposition of a silicon containing material by broadening a selective temperature of formation window for said silicon containing material by decreasing a lower temperature endpoint, said method comprising:
providing a semiconductor wafer with said underlying oxide layer in a processing chamber; then
heating said semiconductor wafer to a first temperature; then
seeding said semiconductor wafer at said first temperature by exposing said semiconductor wafer to a germanium containing gas at pressures between $1^{-8}$ and 100 Torr; and then
annealing said semiconductor wafer at a second temperature so as to grow said silicon containing material.

16. The method of claim 15, wherein said germanium containing gas includes $GeH_4$.

17. The method of claim 15, wherein said silicon containing material is selected from the group consisting of hemispherical grain silicon, amorphous silicon, polycrystalline silicon, SiGe, and SiGeC.

18. The method of claim 15, further comprising: pumping water from said processing chamber, before seeding said semiconductor wafer at said first temperature.

19. The method of claim 18, wherein pumping water from said processing chamber includes heating an alloy of zirconium located within said processing chamber.

20. The method of claim 18, wherein pumping water from said processing chamber includes cooling a cryotrap located within said processing chamber.

21. The method of claim 15, further comprising:
contacting said semiconductor wafer with $Cl_2$ and simultaneously exposing said semiconductor wafer to a source of ultraviolet energy, before seeding said semiconductor wafer at said first temperature.

22. The method of claim 21, further comprising:
exposing said semiconductor wafer to ultraviolet energy, after contacting said semiconductor wafer with $Cl_2$ and simultaneously exposing said semiconductor to said source of ultraviolet energy.

23. The method of claim 21, further comprising contacting said semiconductor wafer with a mixture including HF and $CH_3OH$, before contacting said semiconductor wafer with $Cl_2$ and simultaneously exposing said semiconductor to said source of ultraviolet energy.

24. The method of claim 15, further comprising:
adding hydrogen to said processing chamber, before seeding said semiconductor wafer at said first temperature.

25. The method of claim 15, further comprising:
adding hydrogen to said processing chamber, during seeding said semiconductor wafer at said first temperature.

26. The method of claim 15, further comprising:
adding a chlorine containing precursor to said processing chamber, during seeding said semiconductor wafer at said first temperature.

27. A semiconductor wafer processed by a method according to claim 15.

28. A method of increasing the selectivity of silicon deposition with regard to an underlying oxide layer during deposition of a silicon containing material by broadening a selective temperature of formation window for said silicon containing material by decreasing a lower temperature endpoint, said method comprising:
providing a semiconductor wafer with said underlying oxide layer in a processing chamber; then
heating said semiconductor wafer to a first temperature; then
seeding said semiconductor wafer at said first temperature;
introducing a chlorine containing precursor into said processing chamber during seeding in order to increase the selectivity of the silicon containing material to the underlying oxide layer by etching some silicon deposited during seeding from said underlying oxide layer; and then
annealing said semiconductor wafer at a second temperature so as to grow said silicon containing material.

29. The method of claim 28, further comprising pumping water from said processing chamber, before seeding said semiconductor wafer at said first temperature.

30. The method of claim 29, wherein pumping water from said processing chamber includes heating an alloy of zirconium located within said processing chamber.

31. The method of claim 29, wherein pumping water from said processing chamber includes cooling a cryotrap located within said processing chamber.

32. The method of claim 28, wherein said silicon containing material is selected from the group consisting of hemisherical grain silicon, amorphous silicon, polycrystalline silicon, SiGe, and SiGeC.

33. The method of claim 28, wherein seeding includes exposing said semiconductor wafer to a germanium containing gas.

34. The method of claim 33, wherein said germanium containing gas includes $GeH_4$.

35. The method of claim 28, further comprising:
contacting said semiconductor wafer with $Cl_2$ and simultaneously exposing said semiconductor wafer to a source of ultraviolet energy, before depositing said silicon containing material on said semiconductor wafer.

36. The method of claim 35, further comprising:
exposing said semiconductor wafer to ultraviolet energy, after contacting said semiconductor wafer with $Cl_2$ and simultaneously exposing said semiconductor to said source of ultraviolet energy.

37. The method of claim 35, further comprising contacting said semiconductor wafer with a mixture including HF and $CH_3OH$, before contacting said semiconductor wafer with $Cl_2$ and simultaneously exposing said semiconductor to said source of ultraviolet energy.

38. The method of claim 28, further comprising:
adding hydrogen to said processing chamber, before seeding said semiconductor wafer at said first temperature.

39. The method of claim 28, further comprising:
adding hydrogen to said processing chamber, during seeding said semiconductor wafer at said first temperature.

40. A semiconductor wafer processed by a method according to claim 28.

41. A method of increasing the selectivity of silicon deposition with regard to an underlying oxide layer during deposition of a silicon containing material by broadening a selective temperature of formation window for said silicon containing material by decreasing a lower temperature endpoint, said method comprising:
providing a semiconductor wafer with said underlying oxide layer in a processing chamber; then
heating said semiconductor wafer to a first temperature;
seeding said semiconductor wafer at said first temperature;
introducing hydrogen into said processing chamber during seeding in order to increase the selectivity of the silicon containing material to the underlying oxide; and then
annealing said semiconductor wafer at a second temperature so as to grow said silicon containing material.

42. The method of claim 41, further comprising: pumping water from said processing chamber, before seeding said semiconductor wafer at said first temperature.

43. The method of claim 42, wherein pumping water from said processing chamber includes heating an alloy of zirconium located within said processing chamber.

44. The method of claim 42, wherein pumping water from said processing chamber includes cooling a cryotrap located within said processing chamber.

45. The method of claim 41, wherein said silicon containing material is selected from the group consisting of hemisherical grain silicon, amorphous silicon, polycrystalline silicon, SiGe, and SiGeC.

46. The method of claim 41, wherein seeding includes exposing said semiconductor wafer to a germanium containing gas.

47. The method of claim 46, wherein said germanium containing gas includes $GeH_4$.

48. The method of claim 41, further comprising:
contacting said semiconductor wafer with $Cl_2$ and simultaneously exposing said semiconductor wafer to a source of ultraviolet energy, before seeding said semiconductor wafer at said first temperature.

49. The method of claim 48, further comprising:
exposing said semiconductor wafer to ultraviolet energy, after contacting said semiconductor wafer with $Cl_2$ and simultaneously exposing said semiconductor to said source of ultraviolet energy.

50. The method of claim 48, further comprising contacting said semiconductor wafer with a mixture including HF and $CH_3OH$, before contacting said semiconductor wafer with $Cl_2$ and simultaneously exposing said semiconductor to said source of ultraviolet energy.

51. The method of claim 41, wherein adding hydrogen to said processing chamber takes place before seeding said semiconductor wafer at said first temperature.

52. The method of claim 41, wherein adding hydrogen to said processing chamber takes place simultaneously with seeding said semiconductor wafer at said first temperature.

53. The method of claim 41, further comprising:
adding a chlorine containing precursor to said processing chamber, during seeding said semiconductor wafer at said first temperature.

54. A semiconductor wafer processed by a method according to claim 41.

* * * * *